United States Patent
Leem et al.

(10) Patent No.: US 11,545,515 B2
(45) Date of Patent: Jan. 3, 2023

(54) SENSORS HAVING VISIBLE AND NEAR INFRA-RED LIGHT SENSORS AND OPTICAL FILTER AND ELECTRONIC DEVICES INCLUDING SAME

(71) Applicant: Samsung Electronics Co., Ltd., Suwon-si (KR)

(72) Inventors: Dong-Seok Leem, Seongnam-si (KR); Gae Hwang Lee, Seongnam-si (KR); Ohkyu Kwon, Seoul (KR); Kwang Hee Lee, Hwaseong-si (KR); Hwang Suk Kim, Suwon-si (KR); Bum Woo Park, Hwaseong-si (KR); Hyesung Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 571 days.

(21) Appl. No.: 16/536,583

(22) Filed: Aug. 9, 2019

(65) Prior Publication Data
US 2020/0296269 A1    Sep. 17, 2020

(30) Foreign Application Priority Data
Mar. 13, 2019  (KR) .................. 10-2019-0028740

(51) Int. Cl.
  *H01L 27/146*    (2006.01)
  *G02F 1/17*      (2019.01)
  *H04N 5/225*     (2006.01)

(52) U.S. Cl.
  CPC .......... *H01L 27/14647* (2013.01); *G02F 1/17* (2013.01); *H01L 27/14621* (2013.01);
  (Continued)

(58) Field of Classification Search
  CPC ................... H04N 5/2258; G02F 1/17; H01L 27/14647; H01L 27/14652; H01L 27/14669;
  (Continued)

(56) References Cited

U.S. PATENT DOCUMENTS

| | | |
|---|---|---|
| 8,478,123 B2 | 7/2013 | Cao et al. |
| 9,906,706 B2 | 2/2018 | Wang |

(Continued)

FOREIGN PATENT DOCUMENTS

| | | |
|---|---|---|
| EP | 0232964 B1 * | 3/1991 |
| EP | 3109901 A1 | 12/2016 |

(Continued)

OTHER PUBLICATIONS

European Search Report dated June 2. 2020 for corresponding European Application No. 19205937.6.

*Primary Examiner* — Jennifer D Bennett
(74) *Attorney, Agent, or Firm* — Harness, Dickey & Pierce, P.L.C.

(57) ABSTRACT

A sensor includes a visible light sensor configured to sense light in a visible wavelength spectrum, a near infra-red light sensor on the visible light sensor and configured to sense light in a near infra-red wavelength spectrum, and an optical filter on the near infra-red light sensor and configured to selectively transmit the light in the visible wavelength spectrum and the light in the near infra-red wavelength spectrum, and an electronic device.

12 Claims, 19 Drawing Sheets

(52) U.S. Cl.
CPC ............... *H01L 27/14625* (2013.01); *H01L 27/14652* (2013.01); *H04N 5/2258* (2013.01)

(58) Field of Classification Search
CPC ......... H01L 27/14621; H01L 27/14625; H01L 27/14603; H01L 27/14634; G01J 1/0433; G01J 1/16; G01J 1/42
See application file for complete search history.

(56) References Cited

U.S. PATENT DOCUMENTS

| | | |
|---|---|---|
| 2012/0189293 A1 | 7/2012 | Cao et al. |
| 2014/0015932 A1 | 1/2014 | Kim et al. |
| 2015/0287766 A1* | 10/2015 | Kim .................. H01L 27/14649 257/40 |
| 2015/0311242 A1* | 10/2015 | Bai .................. H01L 27/14647 348/164 |
| 2016/0380032 A1* | 12/2016 | Park ........................ H01L 51/44 257/40 |
| 2017/0034456 A1* | 2/2017 | Kyung .................. H04N 5/238 |
| 2017/0187948 A1 | 6/2017 | Wang |
| 2018/0020169 A1 | 1/2018 | Mogi |
| 2019/0189696 A1* | 6/2019 | Yamaguchi .............. H04N 9/07 |

FOREIGN PATENT DOCUMENTS

| | | |
|---|---|---|
| EP | 3133646 A2 | 2/2017 |
| EP | 3133646 A3 | 3/2017 |
| KR | 20140009774 A | 1/2014 |
| KR | 101684693 B1 | 12/2016 |

\* cited by examiner

FIG. 4
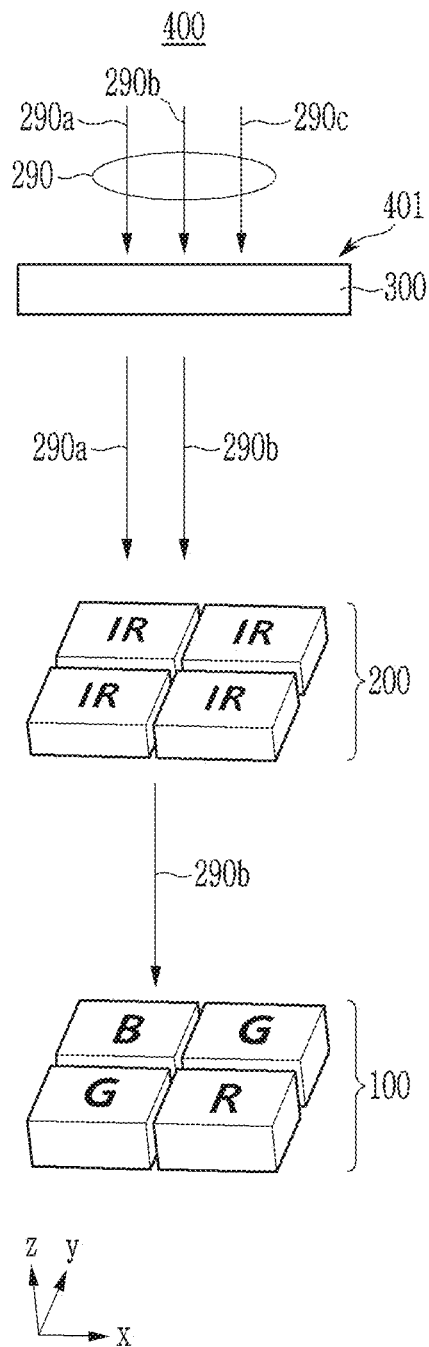
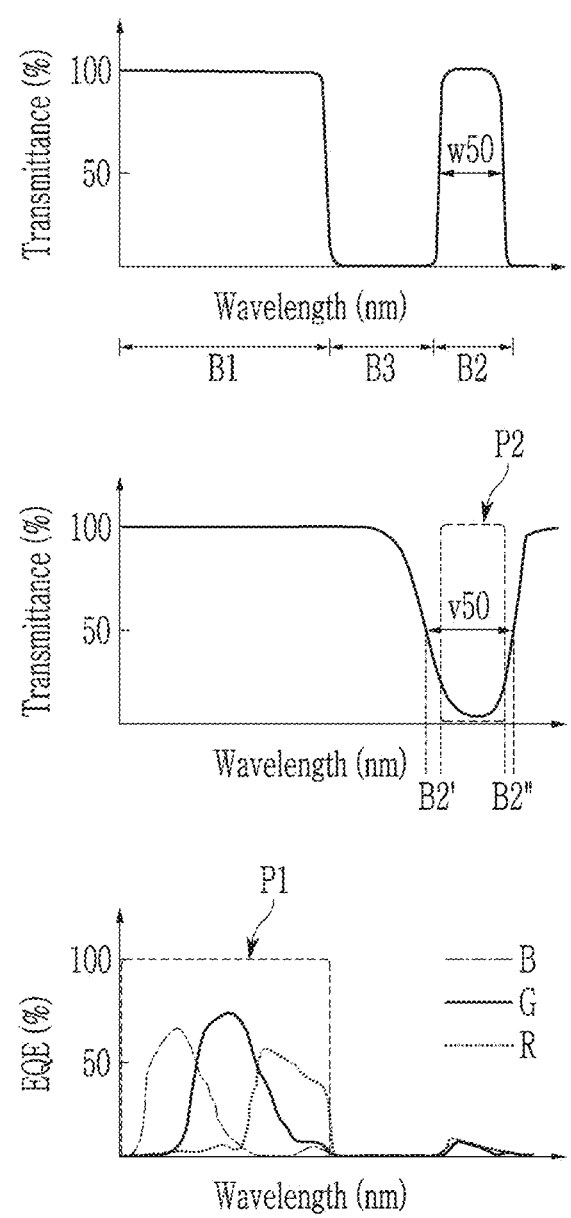

SENSORS HAVING VISIBLE AND NEAR INFRA-RED LIGHT SENSORS AND OPTICAL FILTER AND ELECTRONIC DEVICES INCLUDING SAME

CROSS-REFERENCE TO RELATED APPLICATION

This application claims priority to and the benefit of Korean Patent Application No. 10-2019-0028740 filed in the Korean Intellectual Property Office on Mar. 13, 2019, the entire contents of which are incorporated herein by reference.

BACKGROUND

1. Field

Sensors and electronic devices are disclosed.

2. Description of the Related Art

Imaging devices are used in digital cameras, camcorders, etc., to capture images and to store the captured images as one or more electrical signals. Imaging devices include a sensor that may separate incident light into separate components defined by separate wavelength regions ("wavelength spectra of light") and convert each separate wavelength spectrum-defined component of the incident light to a separate electrical signal.

In recent years, sensors configured to detect light in a near infra-red wavelength spectrum have been researched to improve sensitivity of the sensors in low-illumination environments or for use as biometric or authentication devices.

SUMMARY

Some example embodiments provide a sensor configured to exhibit improved performance without increasing the size or number ("quantity") of sensors.

Some example embodiments provide an electronic device including the sensor.

According to some example embodiments, a sensor may include a visible light sensor configured to sense light in a visible wavelength spectrum, a near infra-red light sensor stacked on the visible light sensor, the near infra-red light sensor being configured to sense light in a near infra-red wavelength spectrum, and an optical filter on the near infra-red light sensor. The optical filter may be configured to selectively transmit the light in the visible wavelength spectrum and the light in the near infra-red wavelength spectrum.

The optical filter may be configured to selectively transmit light in a first wavelength spectrum associated with the visible wavelength spectrum and light in a second wavelength spectrum associated with the near infra-red wavelength spectrum, and selectively block light in a third wavelength spectrum between the first wavelength spectrum and the second wavelength spectrum.

The first wavelength spectrum may be within about 400 nm to about 700 nm and the second wavelength spectrum may be within about 750 nm to about 1000 nm.

A wavelength range of the second wavelength spectrum may be less than or equal to about 120 nm.

The second wavelength spectrum may be about 760 nm to about 860 nm, about 800 nm to about 900 nm, or about 890 nm to about 990 nm.

A transmission spectrum of the optical filter may have a near infra-red transmission peak in the second wavelength spectrum. A wavelength range of the near infra-red transmission peak at a 50% transmittance of the transmission spectrum of the optical filter may be less than or equal to about 120 nm.

Each wavelength range of the near infra-red transmission peak at 70% and 30% transmittances of the transmission spectrum of the optical filter may be less than or equal to about 120 nm.

The near infra-red transmission peak may satisfy Relationship Equations 1 and 2:

$$\lambda_2 - \lambda_1 \leq 50 \text{ nm} \quad \text{[Relationship Equation 1]}$$

$$\lambda_4 - \lambda_3 \leq 50 \text{ nm} \quad \text{[Relationship Equation 2]}$$

wherein, in Relationship Equations 1 and 2, $\lambda_1$ is a starting point wavelength in the near infra-red transmission peak, $\lambda_2$ is a starting point wavelength at which transmittance of the optical filter is greater than or equal to about 50% in the near infra-red transmission peak, $\lambda_3$ is an end-point wavelength at which the transmittance of the optical filter is greater than or equal to about 50% in the near infra-red transmission peak, and $\lambda_4$ is an end-point wavelength of the near infra-red transmission peak.

A maximum transmittance of the near infra-red transmission peak may be greater than or equal to about 90%.

The third wavelength spectrum may be within greater than about 700 nm and less than or equal to about 900 nm.

The near infra-red light sensor may be on the visible light sensor. The near infra-red light sensor may include a pair of electrodes facing each other, and a near infra-red absorption layer between the pair of electrodes. The near infra-red absorption layer may be configured to absorb light in the near infra-red wavelength spectrum.

The near infra-red absorption layer may include an organic light-absorbing material configured to absorb light in the near infra-red wavelength spectrum. The second wavelength spectrum may be narrower than a light absorption spectrum of the organic light-absorbing material.

A full width at half maximum (FWHM) of a light-absorption spectrum of the organic light-absorbing material may be greater than about 120 nm.

The visible light sensor may include a blue sensor configured to sense light in a blue wavelength spectrum, a green sensor configured to sense light in a green wavelength spectrum, and a red sensor configured to sense light in a red wavelength spectrum. The blue sensor, the green sensor, and the red sensor may be integrated in a semiconductor substrate.

The visible light sensor may include a blue sensor configured to sense light in a blue wavelength spectrum, a green sensor configured to sense light in a green wavelength spectrum, and a red sensor configured to sense light in a red wavelength spectrum. Two sensors of the blue sensor, the green sensor and the red sensor may be photodiodes integrated in a semiconductor substrate. A remaining one sensor of the blue sensor, the green sensor, and the red sensor may be a photoelectric device on the semiconductor substrate.

The photoelectric device may include a pair of electrodes facing each other, and a visible absorption layer between the pair of electrodes. The visible absorption layer may be configured to absorb light in one wavelength spectrum of a blue wavelength spectrum, a green wavelength spectrum, and a red wavelength spectrum.

The sensor may further include a color filter layer.

According to some example embodiments, a sensor may include a visible light sensor configured to sense light in a first wavelength spectrum, the first wavelength spectrum within a visible wavelength spectrum, a near infra-red light sensor configured to sense light in a second wavelength spectrum, the second wavelength spectrum within a near infra-red wavelength spectrum, and an optical filter configured to selectively transmit the light in the first wavelength spectrum and the second wavelength spectrum. The near infra-red light sensor may include a pair of electrodes facing each other, and a near infra-red absorption layer between the pair of electrodes. The near infra-red absorption layer may include an organic light-absorbing material configured to absorb light in the near infra-red wavelength spectrum. The second wavelength spectrum may be narrower than an absorption wavelength spectrum of the organic light-absorbing material.

A transmission spectrum of the optical filter may have a visible-light transmission peak in the first wavelength spectrum and a near infra-red transmission peak in the second wavelength spectrum. Each wavelength range of the near infra-red transmission peak at 30%, 50%, and 70% transmittances of the transmission spectrum of the optical filter may be less than or equal to about 120 nm. A wavelength range of a light-absorption peak at 50% absorbance of a light-absorption spectrum of the organic light-absorbing material may be greater than about 120 nm.

The visible light sensor may include a blue sensor configured to sense light in a blue wavelength region, a green sensor configured to sense light in a green wavelength region, and a red sensor configured to sense light in a red wavelength region. The near infra-red light sensor may be on the blue sensor, the green sensor, and the red sensor.

An electronic device may include the sensor.

According to some example embodiments, a sensor may include a visible light sensor configured to sense light in a first wavelength spectrum, the first wavelength spectrum within a visible wavelength spectrum, a near infra-red light sensor on the visible light sensor, the near infra-red light sensor configured to sense light in a second wavelength spectrum, the second wavelength spectrum within a near infra-red wavelength spectrum, and an optical filter configured to selectively transmit the light in the first wavelength spectrum and the second wavelength spectrum.

The sensor may further include a plurality of photoelectric diodes on a semiconductor substrate. Each photoelectric diode of the plurality of photoelectric diodes may be configured to absorb and convert a different wavelength spectrum into electric signals. The plurality of photoelectric diodes may include the visible light sensor and the near infra-red light sensor.

The plurality of photoelectric diodes may be stacked vertically on the semiconductor substrate, such that the plurality of photoelectric diodes overlap each other in a direction extending perpendicular to a top surface of the semiconductor substrate.

The plurality of photoelectric diodes may be arranged horizontally on the semiconductor substrate, such that the plurality of photoelectric diodes overlap each other in a direction extending parallel to a top surface of the semiconductor substrate.

The sensor may further include a photodiode integrated in a semiconductor substrate. The photodiode may be configured to convert a separate wavelength spectrum into electric signals.

The sensor may further include a color filter configured to selectively transmit another wavelength spectrum of incident light to the photodiode. The another wavelength spectrum of incident light may include at least the separate wavelength spectrum, such that the photodiode is configured to absorb the separate wavelength spectrum.

An electronic device may include the sensor.

BRIEF DESCRIPTION OF THE DRAWINGS

FIG. 4 is an optical spectrum showing optical properties of an optical filter, a near infra-red light sensor, and a visible light sensor in a sensor according to some example embodiments.

DETAILED DESCRIPTION

Figure 1:
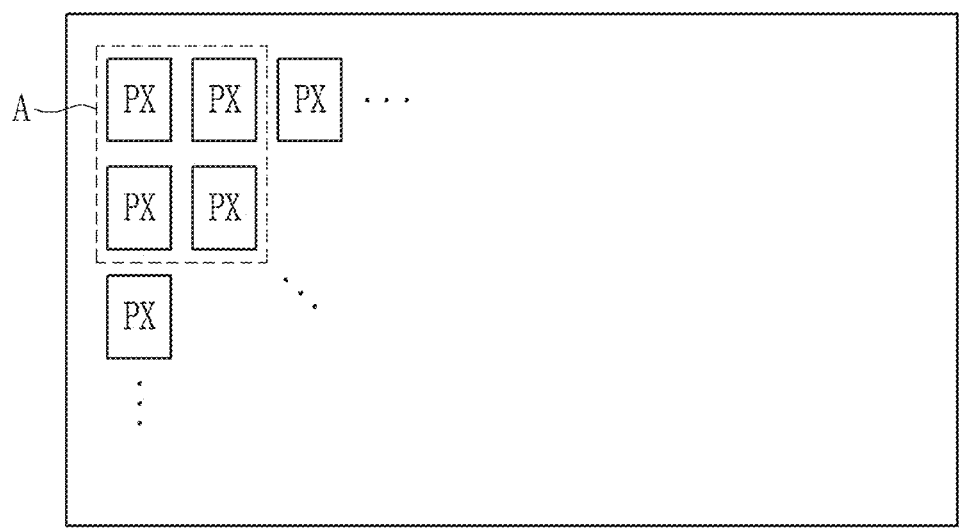
FIG. 1 is a schematic view showing an example of a pixel array of a sensor according to some example embodiments.

Hereinafter, some example embodiments will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a sensor according to some example embodiments is described.

Figure 2:
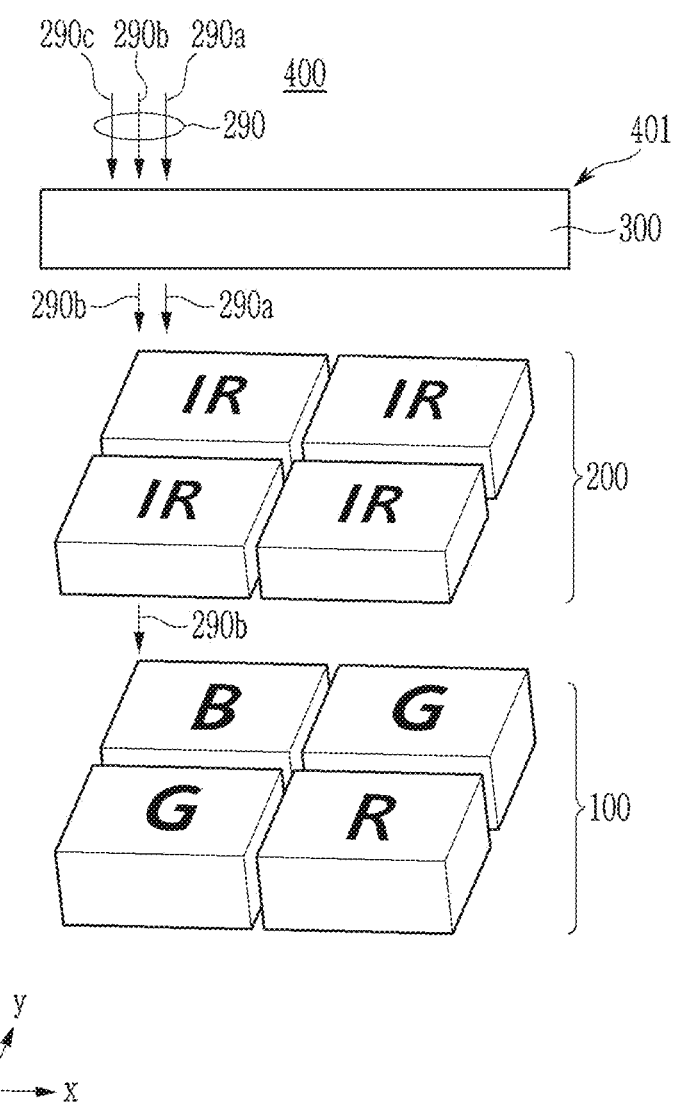
FIG. 2 is a schematic view showing an example of a unit pixel group of the sensor of FIG. 1 according to some example embodiments.

FIG. 1 is a schematic view showing an example of a pixel array of a sensor according to some example embodiments, and FIG. 2 is a schematic view showing an example of a unit pixel group of the sensor of FIG. 1 according to some example embodiments.

Referring to FIG. 1, a sensor 400 according to some example embodiments includes a plurality of pixels (PX) and the plurality of pixels (PX) may have a matrix array repeatedly arranged along rows and columns. The plurality of pixels (PX) may form ("at least partially comprise") a unit pixel group (A) of for example a 2×2 array of pixels, for example as shown in FIG. 1. However, an arrangement of the pixels are not limited thereto but variously modified, and the unit pixel group (A) may be variously modified into different arrays of pixels, including a 3×3 array, a 4×4 array, or the like, besides the 2×2 array.

At least a part of the pixels may include a plurality of sensors having different functions inside one pixel, and the plurality of sensors may be stacked therein. In some example embodiments, each pixel (PX) may include two or more sensors that are configured to sense (e.g., absorb) light in different wavelength regions ("wavelength spectra of light") in relation to each other, and the sensors configured to sense the light in different wavelength regions each other may be stacked in a direction that is perpendicular (e.g., perpendicular within manufacturing tolerances and/or material tolerances) to a top surface 110S of a substrate of the sensor 400, as shown in at least FIG. 5 (e.g., a Z direction). Herein, the light of the different wavelength regions may be respectively selected from a visible wavelength region; an infra-red wavelength region including a near infra-red wavelength region; and an ultraviolet (UV) wavelength region.

Referring to FIG. 2, a sensor 400 according to some example embodiments includes a sensor 100 configured to sense light in a visible region ("visible wavelength spectrum of light") (hereinafter, referred to as a 'visible light sensor'), a sensor 200 configured to sense light in a near infra-red region ("near infra-red wavelength spectrum of light") (hereinafter, referred to as a 'near infra-red light sensor'), and an optical filter 300. Accordingly, the sensor 400 may in some example embodiments be referred to as a sensor assembly that includes sensors 100 and 200 and optical filter 300.

As shown in FIG. 2, the visible light sensor 100 and the near infra-red light sensor 200 may be stacked on each other in the Z-direction and in some example embodiments, the near infra-red light sensor 200 may be disposed on the visible light sensor 100, such that the near infra-red light sensor 200 may be proximate to an incident light side 401 of the sensor 400, relative to the visible light sensor 100, such that incident light 290 that is incident on the sensor 400 at the incident light side 401 may pass through the near infra-red light sensor 200 to reach the visible light sensor 100. The visible light sensor 100 and the near infra-red light sensor 200 are may independently include a separate photosensing device such as a photodiode or a photoelectric device. Referring back to FIG. 1, each separate pixel (PX) or unit pixel group (A) may include a separate portion (e.g., separate pixel or pixel group) of sensor 100 and sensor 200. As described herein, when sensor 100 and/or 200 is described as having a pixel or unit pixel group (A), it will be understood that reference is being made to a portion of the sensor 100 and/or 200 that is included within a pixel (PX) or unit pixel group (A) of the sensor 400 as shown in at least FIG. 1.

The visible light sensor 100 is a sensor configured to sense at least a part of light in a visible wavelength region ("visible wavelength spectrum") ranging from about 400 nm to about 700 nm (e.g., light 290b of incident light 290). The visible light sensor 100 may be for example an image sensor configured to separate incident light into light in a blue wavelength region ("blue wavelength spectrum"), light in a green wavelength region ("green wavelength spectrum"), and light in a red wavelength region ("red wavelength spectrum"), to convert each separate light to a separate electric signal, and thus to realize a color image.

In some example embodiments, the unit pixel group (A) of the visible light sensor 100 (e.g., a portion of the visible light sensor 100 that is included in unit pixel group (A) of sensor 400) may include a blue pixel (B) configured to sense light in a blue wavelength region, a green pixel (G) configured to sense light in a green wavelength region, and a red pixel (R) configured to sense light in a red wavelength region, for example, two green pixels (G). In some example embodiments, the blue wavelength region, the green wavelength region, and the red wavelength region may be respectively in a range of greater than or equal to about 400 nm and less than 500 nm, about 500 nm to about 600 nm, and greater than about 600 nm and less than or equal to about 700 nm.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

The visible light sensor 100 may have a structure of being integrated in a semiconductor substrate such as a silicon substrate, a structure of being stacked on the semiconductor substrate, or a combination thereof. It will be understood that, as shown in at least FIG. 5, an element that is "integrated in" another element is at least partially encompassed by the other element such that the element is partially or entirely located within a volume space that is defined by the outer surfaces of the other element.

The near infra-red light sensor 200 may be a sensor configured to sense light in a near infra-red wavelength region or a part thereof (e.g., light 290a of light 290), and may be configured to selectively absorb for example light in a part of a near infra-red wavelength region to convert the absorbed light (e.g., light 290a) into a signal. It will be understood that a near infra-red wavelength region that a near infra-red light sensor 200 is configured to sense may be a limited portion or an entirety of the near infra-red wavelength spectrum. The near infra-red wavelength region may for example within greater than about 700 nm and less than or equal to about 3000 nm, about 750 nm to about 3000 nm, about 750 nm to about 1500 nm, about 750 nm to about 1100 nm, about 750 nm to about 1000 nm, about 760 nm to about 1000 nm, about 800 nm to about 1000 nm, about 760 nm to about 860 nm, about 800 nm to about 900 nm, about 850 nm to about 990 nm, about 870 nm to about 990 nm, or about 890 nm to about 990 nm.

The near infra-red light sensor 200 may include a near infra-red absorption layer configured to selectively absorb light (e.g., light 290a) in a near infra-red wavelength region or a part of same and the near infra-red light sensor 200 may include, for example a pair of electrodes facing each other and a near infra-red absorption layer between the pair of electrodes. In some example embodiments, the near infra-red absorption layer may include an organic light-absorbing material configured to absorb a part of a near infra-red wavelength region. Light absorption characteristics of the near infra-red light sensor 200 may be exhibited as a light-absorption spectrum (a transmission spectrum) of the near infra-red absorption layer, and for example, the light-absorption spectrum (transmission spectrum) of the near infra-red absorption layer may have a maximum absorption wavelength (a minimum transmission wavelength) in a range of about 750 nm to about 1000 nm, about 780 nm to about 980 nm, or about 800 nm to about 950 nm. A full width at half maximum (FWHM) of the light-absorption spectrum (transmission spectrum) of the near infra-red absorption layer may be in a range of greater than about 120 nm, for example, greater than or equal to about 150 nm, greater than or equal to about 180 nm, or greater than or equal to about 200 nm.

The near infra-red light sensor 200 may be for example a biometric sensor and may be for example an iris sensor, a depth sensor, a fingerprint sensor, a blood vessel distribution sensor, and the like. The iris sensor may identify a person by using unique iris characteristics of every person and specifically, capturing an image of an eye of a user within an appropriate distance, processing the image, and comparing it with his/her stored image. The depth sensor may identify a shape and a location of an object from its three-dimensional information by capturing an image of the object within an appropriate distance with a user and processing the image. This depth sensor may be for example used as a face recognition sensor.

In some example embodiments, the unit pixel group (A) of the near infra-red light sensor 200 (e.g., a portion of the near infra-red light sensor 200 that is included in the unit pixel group (A) of sensor 400) may include a plurality of near infra-red pixels (IR) configured to sense light in the near infra-red wavelength region, and the plurality of near infra-red pixels (IR) may be the same or different in relation to each other (e.g., may be configured to sense light having different wavelength spectra in relation to each other).

The optical filter 300 is disposed on the front side (an incident light side 401) of the sensor 400, in some example embodiments, on a side of the near infra-red light sensor 200 that is proximate to the incident light side 401. The optical filter 300 may be configured to selectively transmit light in a first wavelength region (e.g., light 290b) associated with (e.g., including) a wavelength region configured to be sensed by the visible light sensor 100 and light in a second wavelength region (e.g., light 290a) associated with (e.g., including) a wavelength region configured to be sensed by the near infra-red light sensor 200, but the optical filter 300 may be configured to selectively block light in the other regions (e.g., wavelength regions other than the first wavelength region and the second wavelength region) by reflection or absorption. The light blocked through the reflection or absorption (e.g., light 290c) includes light in a third wavelength region between the first wavelength region and the second wavelength region (e.g., a wavelength spectrum of wavelengths that are between the wavelengths of the first wavelength spectrum and the wavelengths of the second wavelength spectrum).

In some example embodiments, the first wavelength region may be within about 400 nm to about 700 nm and the second wavelength region may be for example within greater than about 700 nm and less than or equal to about 3000 nm, about 750 nm to about 3000 nm, about 750 nm to about 1500 nm, about 750 nm to about 1100 nm, about 750 nm to about 1000 nm, about 760 nm to about 1000 nm, about 800 nm to about 1000 nm, about 760 nm to about 860 nm, about 800 nm to about 900 nm, about 850 nm to about 990 nm, about 870 nm to about 990 nm, or about 890 nm to about 990 nm. A width ("wavelength range") of the second wavelength region may be for example less than or equal to about 150 nm, less than or equal to about 120 nm, or less than or equal to about 100 nm, for example about 50 nm to about 150 nm, about 50 nm to about 120 nm, or about 50 nm to about 100 nm. In some example embodiments, the first wavelength region may be about 400 nm to about 700 nm and the second wavelength region may be a region having a width of less than or equal to about 150 nm, less than or equal to about 120 nm, or less than or equal to about 100 nm in a wavelength region belonging to about 750 nm to about 1000 nm. The second wavelength region may be for example 760 nm to about 860 nm, about 800 nm to about 900 nm, or about 890 nm to about 990 nm. In some example embodiments, the third wavelength region may be within greater than about 700 nm and less than or equal to about 1000 nm, for example greater than about 700 nm and less than or equal to about 900 nm.

Optical properties of the optical filter 300 may be expressed by a transmission spectrum, and in some example embodiments, the transmission spectrum of the optical filter 300 may exhibit high transmittance in the first wavelength region and the second wavelength region but low transmittance in the third wavelength region.

Figure 3:
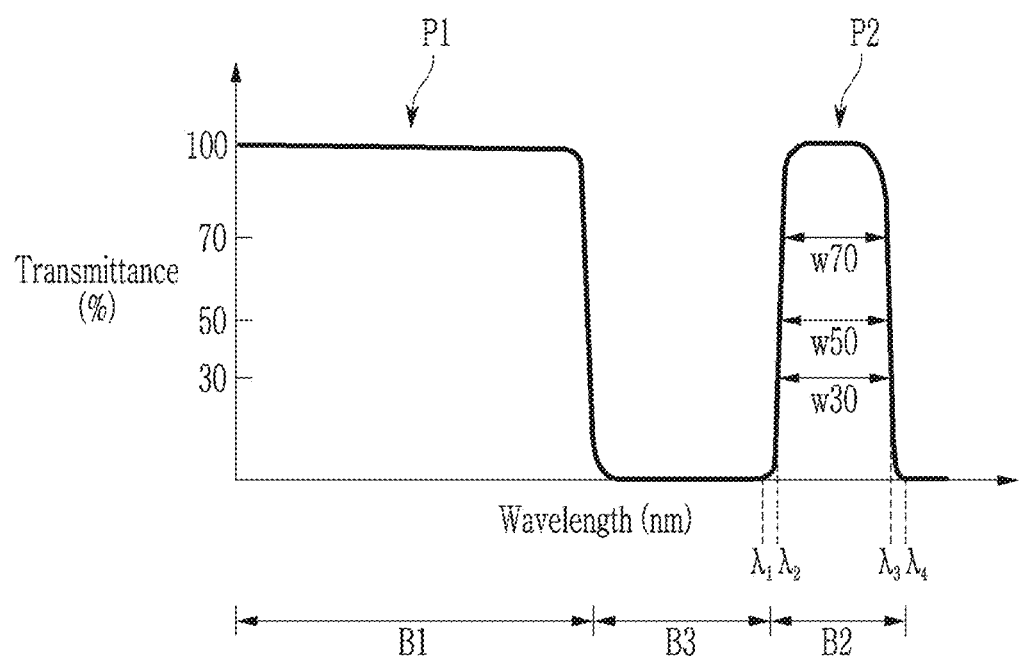
FIG. 3 is a transmission spectrum of an optical filter according to some example embodiments.

FIG. 3 is a transmission spectrum of an optical filter 300 according to some example embodiments.

Referring to FIG. 3, the transmission spectrum of the optical filter 300 may exhibit high transmittance in the first wavelength region (B1) and the second wavelength region (B2) but low transmittance in the third wavelength region (B3) between the first wavelength region (B1) and the second wavelength region (B2).

In some example embodiments, the transmission spectrum of the optical filter 300 may have a visible-light transmission peak (P1) in the first wavelength region (B1) and a near infra-red transmission peak (P2) in the second wavelength region (B2).

The visible-light transmission peak (P1) may exhibit a substantially uniform transmittance over the first wavelength region (B1), and a maximum transmittance of the visible-light transmission peak (P1) may be for example greater than or equal to about 85%, greater than or equal to about 88%, greater than or equal to about 90%, greater than or equal to about 92%, greater than or equal to about 93%, greater than or equal to about 95%, greater than or equal to about 97%, greater than or equal to about 98%, or greater than or equal to about 99%.

The near infra-red transmission peak (P2) may exhibit substantially uniform transmittance over the second wavelength region (B2), and a maximum transmittance of the near infra-red transmission peak (P2) may be for example greater than or equal to about 85%, greater than or equal to about 88%, greater than or equal to about 90%, greater than or equal to about 92%, greater than or equal to about 93%, greater than or equal to about 95%, greater than or equal to about 97%, greater than or equal to about 98%, or greater than or equal to about 99%.

The near infra-red transmission peak (P2) has a steep slope and in some example embodiments, may substantially exhibit a step function spectrum profile. A width (e.g., wavelength range) of the near infra-red transmission peak (P2) may not be greatly changed depending on transmittance, in some example embodiments, the widths (w30, w50, and w70) of the near infra-red transmission peak (P2) may not be much different one another at the transmittances (30%, 50%, and 70%) of the transmission spectrum of the optical filter 300, and in some example embodiments, each difference among the widths (w30, w50, and w70) of the near infra-red transmission peak (P2) at the transmittances (30%, 50%, and 70%) may be less than or equal to about 50 nm, less than or equal to about 40 nm, less than or equal to about 30 nm, less than or equal to about 20 nm, or less than or equal to about 10 nm. In some example embodiments, each width (e.g., wavelength range) of the near infra-red transmission peak at a 50% transmittance of the transmission spectrum of the optical filter 300 is less than or equal to about 120 nm. In some example embodiments, each width (e.g., wavelength range) of the near infra-red transmission peak at 70% and 30% transmittances of the transmission spectrum of the optical filter 300 is less than or equal to about 120 nm.

In some example embodiments, the near infra-red transmission peak (P2) may satisfy Relationship Equations 1 and 2.

$\lambda_2 - \lambda_1 \leq 50$ nm     [Relationship Equation 1]

$\lambda_4 - \lambda_3 \leq 50$ nm     [Relationship Equation 2]

In Relationship Equations 1 and 2, $\lambda_1$ is a starting point wavelength in the near infra-red transmission peak (P2), $\lambda_2$ is a starting point wavelength at which the transmittance (e.g., the transmittance of the optical filter 300) is greater than or equal to about 50% in the near infra-red transmission peak (P2), $\lambda_3$ is an end-point wavelength at which the transmittance is greater than or equal to about 50% in the near infra-red transmission peak (P2), and $\lambda_4$ is an end-point wavelength of the near infra-red transmission peak (P2).

In some example embodiments, the near infra-red transmission peak (P2) may satisfy Relationship Equations 1a and 2a.

$\lambda_2 - \lambda_1 \leq 40$ nm     [Relationship Equation 1a]

$\lambda_4 - \lambda_3 \leq 40$ nm     [Relationship Equation 2a]

In some example embodiments, the near infra-red transmission peak (P2) may satisfy Relationship Equations 1aa and 2aa.

$\lambda_2 - \lambda_1 \leq 30$ nm     [Relationship Equation 1aa]

$\lambda_4 - \lambda_3 \leq 30$ nm     [Relationship Equation 2]

In this way, the sensor 100 includes the above optical filter 300 and accordingly, may effectively block light in the near infra-red wavelength region adjacent to the visible wavelength region, that is, the third wavelength region and thus effectively prevent or reduce a damage on a color image of the visible light sensor 100 by the light in the near infra-red wavelength region, thereby improving performance of the visible light sensor 100 and thus the sensor 400 as a whole.

FIG. 4 is an optical spectrum showing optical properties of an optical filter 300, a near infra-red light sensor 200, and a visible light sensor 100 in a sensor 400 according to some example embodiments.

Referring to FIG. 4, the optical filter 300 at the front side of the sensor 400 (e.g., at incident light side 401) may receive incident light 290 (which includes light components or "light" 290a, 290b, and 290c) be configured to selectively transmit light in the first wavelength region (B1) (e.g., light 290b) and the second wavelength region (B2) (e.g., light 290a) out of the incident light 290 (e.g., selectively filtering and/or absorbing light 290c of incident light 290), and out of the transmitted light (light 290a and 290b), near infra-red light in the second wavelength region (B2) (e.g., light 290a) may be selectively absorbed and photoelectrically converted by the near infra-red light sensor 200, which works as a sensor, and in addition, the light of the first wavelength region (B1) (e.g., light 290b) passing the near infra-red light sensor 200 may be configured to be sensed by the visible light sensor 100, which works as an image sensor.

However, when the aforementioned optical filter 300 is not included, light of the near infra-red wavelength region out of the incident light may be configured to be absorbed by the near infra-red light sensor 200, but a light absorbing material included in the near infra-red light sensor 200 actually shows a Gaussian spectrum profile, unlike the step function spectrum profile of the above optical filter 300, and thus may not completely block light in the near infra-red wavelength region adjacent to the visible wavelength region. Accordingly, light in wavelength regions (B2', B2") adjacent to the second wavelength region (B2) may inevitably flow into the visible light sensor 100 and thus do damage on a color image of the visible light sensor 100.

The optical filter 300 may exhibit transmission characteristics like the step function spectrum profile as aforementioned and accordingly, may be configured to block in advance the light in the near infra-red wavelength region from inevitably entering the visible light sensor 100 and thus increase purity of light reaching the visible light sensor 100. In some example embodiments, in the optical filter 300, the width (w50) of the near infra-red transmission peak (P2) at the transmittance of 50% may be narrower than the width (v50) of the near infra-red absorption peak at absorbance of 50% (transmittance of 50%) of the near infra-red light sensor 200, and accordingly, the optical filter 300 may be configured to block in advance light in the wavelength regions (B2', B2") adjacent to the second wavelength region (B2) and prevent or mitigate it from flowing into the visible light sensor 100. Accordingly, in a sensor having a stacked structure of the near infra-red light sensor 200 and the visible light sensor 100 in the Z-direction, the visible light sensor 100 may reduce an influence of the optical filter 300 on the near infra-red light sensor 200 and thus realize a satisfactory color image.

Accordingly, the sensor 400 may not only include two sensors performing separate functions and thus function as a composite sensor but also greatly improve sensitivity by stacking the two sensors and thus doubling the number of pixels functioning as each sensor, while maintaining a size thereof. Thus, sensor 400 performance and size efficiency may be improved. In addition, the sensor 400 may increase purity of visible light reaching visible light sensor 100 and thus realize (e.g., generate) a satisfactory (e.g., improved) color image.

Figure 5:
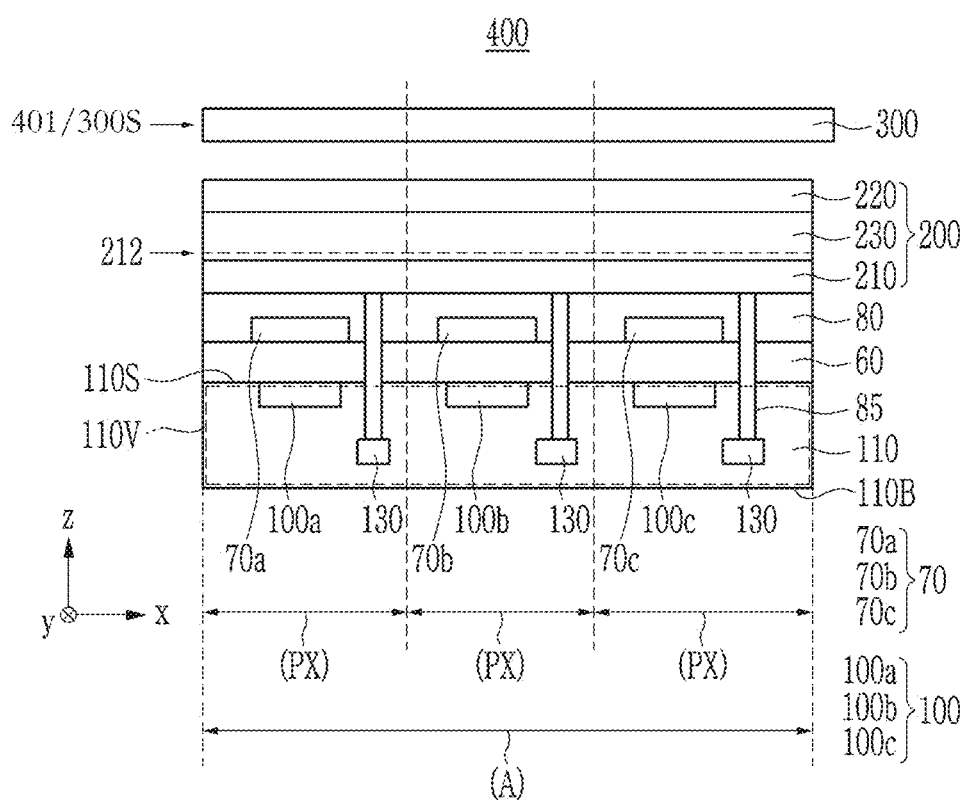
FIG. 5 is a cross-sectional view that schematically shows an example of a sensor according to some example embodiments.

FIG. 5 is a cross-sectional view that schematically shows an example of a sensor according to some example embodiments.

Referring to FIG. 5, a sensor 400 according to some example embodiments includes the visible light sensor 100, the near infra-red light sensor 200, and the optical filter 300, and the visible light sensor 100 may be a photodiode integrated in a semiconductor substrate 110, and the near infra-red light sensor 200 may be a photoelectric device configured to absorb and photoelectrically convert near infra-red light. As shown in FIG. 5, the optical filter 300, near infra-red light sensor 200, and visible light sensor 100 may be stacked in the Z-direction ("vertical direction") that is perpendicular to the top surface 110S of the semiconductor substrate 110.

As shown in FIG. 5, the visible light sensor 100 may be integrated in the semiconductor substrate 110 such that the visible light sensor is at least partially (e.g., entirely as shown in FIG. 5) encompassed within a volume space 110V that is defined by outer surfaces (e.g., top surface 110S and bottom surface 110S) of the semiconductor substrate 110. The visible light sensor 100 may include a blue sensor 100a configured to sense light in a blue wavelength region, a green sensor 100b configured to sense light in a green wavelength region, and a red sensor 100c configured to sense light in a red wavelength region. As shown in FIG. 5, the blue sensor 100a, the green sensor 100b, and the red sensor 100c may be integrated in the semiconductor substrate 110. The blue sensor 100a may be integrated in a blue pixel, the green sensor 100b may be integrated in a green pixel, and the red sensor 100c may be integrated in a red pixel.

The semiconductor substrate 110 may be for example a silicon substrate and may be integrated with the visible light sensor 100, a charge storage 130, and a transmission transistor (not shown), and a transmission transistor (not shown). The visible light sensor 100 may sense light in a visible wavelength region passing the optical filter 300, the near infra-red light sensor 200, and a color filter layer 70, and the sensed information may be transferred by a transmission transistor. A charge storage 130 may be electrically connected to the near infra-red light sensor 200.

A metal wire (not shown) and a pad (not shown) are formed on the semiconductor substrate 110. In order to decrease signal delay, the metal wire and pad may be made of a metal having low resistivity, in some example embodiments, aluminum (Al), copper (Cu), silver (Ag), and alloys thereof, but are not limited thereto. Further, it is not limited to the structure, and the metal wire and pad may be disposed under the blue sensor 100a, the green sensor 100b, and the red sensor 100c.

The lower insulation layer 60 is formed on the semiconductor substrate 110. The lower insulation layer 60 may be made of an inorganic insulating material such as a silicon oxide and/or a silicon nitride, or a low dielectric constant (low K) material such as SiC, SiCOH, SiCO, and SiOF.

The color filter layer 70 is formed on the lower insulation layer 60. The color filter layer 70 may include a blue filter 70a configured to selectively transmit light in a blue wavelength region, a green filter 70b configured to selectively transmit light in a green wavelength region, and a red filter 70c configured to selectively transmit light in a red wavelength region. The blue filter 70a, the green filter 70b, and the red filter 70c are respectively overlapped in a vertical direction (e.g., Z-direction) with separate, respective sensors (e.g., photodiodes) of a blue sensor 100a, a green sensor 100b, and a blue sensor 100c. The blue filter 70a may selectively transmit light in the blue wavelength region and transfer it to the blue sensor 100a such that the blue sensor 100a is configured to absorb the light in the blue wavelength region, the green filter 70b may selectively transmit light in the green wavelength region and transfer it to the green sensor 100b such that the green sensor 100b is configured to absorb the light in the green wavelength region, and the red filter 70c may selectively transmit light in the red wavelength region and transfer it to the red sensor 100c such that the red sensor 100c is configured to absorb the light in the red wavelength region. However, the inventive concepts are not limited thereto, but at least one of the blue filter 70a, the green filter 70b, and the red filter 70c may be replaced with a yellow filter, a cyan filter, or a magenta filter. Herein, a structure of disposing the color filter layer 70 between the visible light sensor 100 and the near infra-red light sensor 200 is illustrated, but the inventive concepts are not limited thereto, and the color filter layer 70 may be disposed on the near infra-red light sensor 200 such that the near infra-red light sensor 200 is between the color filter layer 70 and the visible light sensor 100. In some example embodiments, a color filter that vertically overlaps with one or more sensors (e.g., photodiodes) may be configured to selectively transmit a wavelength spectrum of light that includes the wavelength spectrum of light that the one or more sensors are individually configured to sense. The wavelength spectrum of light selectively transmitted by the color filter may be greater in wavelength range than the specific wavelength spectrum of light that the one or more sensors are individually configured to sense. For example, in some example embodiments, the blue filter 70a may be configured to selectively transmit a particular wavelength spectrum of light that includes the blue wavelength region that the blue sensor 100a is configured to detect, and the particular wavelength spectrum of light may further include additional wavelengths beyond the blue wavelength region. In some example embodiments, the color filter layer 70 may be absent, and one or more of the photodiodes of the blue sensor 100a, green sensor 100b, and red sensor 100c may be configured to selectively sense blue light, green light, and red light, respectively, independently of the light incident on the respective sensors being filtered to selectively transmit the blue light, green light, and red light, respectively.

An upper insulation layer 80 is formed on the color filter layer 70. The upper insulation layer 80 may be for example a planarization layer. The lower insulation layer 60 and the upper insulation layer 80 may have a trench 85 exposing the charge storage 130. The trench 85 may be filled with fillers. At least one of the lower insulation layer 60 and the upper insulation layer 80 may be omitted.

The near infra-red light sensor 200 may be disposed on the upper insulation layer 80 and thus may be on the visible light sensor 100 and thus may be on the blue sensor 100a, the green sensor 100b, and the red sensor 100c. The near infra-red light sensor 200 includes a lower electrode 210 and an upper electrode 220 facing each other and a near infra-red absorption layer 230 between the lower electrode 210 and the upper electrode 220.

One of the lower electrode 210 and the upper electrode 220 is an anode and the other is a cathode. Both of the lower electrode 210 and the upper electrode 220 may be a light-transmitting electrode, and the light-transmitting electrode may be made of, in some example embodiments, a transparent conductor such as indium tin oxide (ITO) or indium zinc oxide (IZO), or may be a metal thin layer having a thin thickness of several nanometers or several tens of nanometers or a metal thin layer having a thin thickness of several nanometers to several tens of nanometers doped with a metal oxide. As shown in FIG. 5, separate sensors of sensors 100a, 100b, and 100c, and corresponding separate portions of the near infra-red light sensor 200 that overlap said separate, respective sensors in the Z-direction ("vertical direction") may be included in separate pixels (PX) of the sensor 400. As further shown in FIG. 5, said separate pixels (PX) may be included in a common unit pixel group (A) of the sensor 400.

The near infra-red absorption layer 230 may selectively absorb light in a near infra-red wavelength region, which may be the near infra-red wavelength region of light that the near infra-red light sensor 200 is configured to sense. The near infra-red absorption layer 230 may include an organic light-absorbing material configured to absorb a part of the near infra-red wavelength region (e.g., the second wavelength region (B2). In some example embodiments, the second wavelength region (B2) may be narrower in wavelength range than a light absorption region (e.g., light absorption spectrum) of the organic light-absorbing material of the near infra-red absorption layer 230. A light-absorption spectrum of the near infra-red absorption layer 230 may for example have a light-absorption peak having a maximum absorption wavelength ($\lambda_{max}$) at the center, in some example embodiments, in a range of $\lambda_{max} \pm 100$ nm, for example in a range of $\lambda_{max} \pm 90$ nm, for example in a range of $\lambda_{max} \pm 80$ nm, for example in a range of $\lambda_{max} \pm 70$ nm, or for example in a range of $\lambda_{max} \pm 65$ nm but is not limited thereto. The maximum absorption wavelength ($\lambda_{max}$) may for example belong to a range of about 750 nm to about 1000 nm, in some example embodiments, a range of about 780 nm to about 980 nm or about 800 nm to about 950 nm. A full width at half maximum (FWHM) of the light-absorption spectrum of the near infra-red absorption layer 230 (e.g., a FWHM of the light-absorption spectrum of the organic light-absorbing material of the near infra-red absorption layer 230) may be greater than about 120 nm, in some example embodiments, greater than or equal to about 150 nm, greater than or equal to about 180 nm, greater than or equal to about 200 nm, greater than about 120 nm and less than or equal to about 300 nm, about 150 nm to about 300 nm, about 180 nm to about 300 nm, or about 200 nm to about 300 nm.

An absorbance at the maximum absorption wavelength ($\lambda_{max}$) of the near infra-red absorption layer 230 may be greater than or equal to about 50%, for example greater than or equal to about 60%, greater than or equal to about 70%, greater than or equal to about 75%, greater than or equal to about 80%, greater than or equal to about 85%, greater than or equal to about 88%, greater than or equal to about 90%, greater than or equal to about 92%, greater than or equal to about 95%, greater than or equal to about 97%, greater than or equal to about 98%, greater than or equal to about 99%, greater than or equal to about 99.5%, greater than or equal to about 99.9%, or greater than or equal to about 100%. The width (wavelength range) of the near infra-red absorption peak at absorbance of 50% (transmittance of 50%) of the light-absorption spectrum of the organic light-absorbing material of the near infra-red absorption layer 230 may be greater than about 120 nm.

The near infra-red absorption layer 230 may include a p-type semiconductor and an n-type semiconductor and the p-type semiconductor and the n-type semiconductor may form a pn junction.

At least one semiconductor of the p-type semiconductor or the n-type semiconductor may be a light absorbing material configured to selectively absorb an infra-red light in a particular (or, alternatively, predetermined) region including a maximum absorption wavelength ($\lambda_{max}$). The p-type semiconductor and the n-type semiconductor may independently include an organic material, an inorganic material, and/or an organic/inorganic material. At least one of the p-type semiconductor and the n-type semiconductor may include an organic material, a semiconductor nanocrystal such as a quantum dot, or a combination thereof which selectively absorbs infra-red light in a particular (or, alternatively, predetermined) region including a maximum absorption wavelength ($\lambda_{max}$).

At least one semiconductor of the p-type semiconductor or the n-type semiconductor may be a quantum dot, a quinoid metal complex compound, a polymethine compound, a cyanine compound, a phthalocyanine compound, a merocyanine compound, a naphthalocyanine compound, an immonium compound, a diimmonium compound, a triarylmethane compound, a dipyrromethene compound, an anthraquinone compound, naphthoquinone, a diquinone compound, a naphthoquinone compound, an anthraquinone compound, a squarylium compound, a rylene compound, a perylene compound, a squaraine compound, a pyrylium compound, a squaraine compound, a thiopyrylium compound, a diketopyrrolopyrrole compound, a boron dipyrromethene compound, a nickel-dithiol complex compound, a croconium compound, a derivative thereof, or any combination thereof, but example embodiments are not limited thereto.

In some example embodiments, the p-type semiconductor may include the aforementioned compounds and the n-type semiconductor may be for example fullerene such as C60 or C70, non-fullerene, thiophene, a derivative thereof, or any combination thereof, but is not limited thereto.

The near infra-red absorption layer 230 may be a single layer or a multilayer. The near infra-red absorption layer 230 may have for example various combinations of an intrinsic layer (I layer), a p-type layer/I layer, a I layer/n-type layer, a p-type layer/I layer/n-type layer, or a p-type layer/n-type layer.

The intrinsic layer (I layer) may include the p-type semiconductor and the n-type semiconductor in a volume ratio of about 1:100 to about 100:1. The p-type semiconductor and the n-type semiconductor may be mixed in a volume ratio of about 1:50 to about 50:1, about 1:10 to about 10:1, or about 1:1. When the p-type and n-type semiconductors have a composition ratio within the range, an exciton may be effectively produced and a pn junction may be effectively formed.

The p-type layer may include the p-type semiconductor, and the n-type layer may include the n-type semiconductor.

The near infra-red absorption layer 230 may have a thickness of about 1 nm to about 500 nm, in some example embodiments, about 5 nm to about 300 nm or about 5 nm to about 200 nm.

The near infra-red absorption layer 230 may be formed on a whole ("entire") surface of the sensor 400. Accordingly, the infra-red light including the maximum absorption wavelength ($\lambda_{max}$) may be configured to be selectively absorbed on the whole surface of the sensor 400 and thus high absorption efficiency may be obtained by increasing an light area of the near infra-red light sensor 200.

The near infra-red absorption layer 230 may selectively absorb the infra-red light in a particular (or, alternatively, predetermined) region including the maximum absorption wavelength ($\lambda_{max}$) to generate excitons, then generated excitons may be separated into holes and electrons, and then separated holes transfer to an anode that is one of the lower electrode 210 and the upper electrode 220 and separated electrons transfer to a cathode that is one of the lower electrode 210 and the upper electrode 220 to provide a photoelectric conversion effect. The separated electrons and/or holes may be collected in the charge storage 130.

An auxiliary layer 212 may be further disposed between the lower electrode 210 and the near infra-red absorption layer 230 and/or between the upper electrode 220 and the near infra-red absorption layer 230. The auxiliary layer may be a charge auxiliary layer, a light-absorbing auxiliary layer, or any combination thereof, but is not limited thereto.

The auxiliary layer 212 may include for example at least one of a hole injection layer (HIL) for facilitating hole injection, a hole transport layer (HTL) for facilitating hole transport, an electron blocking layer (EBL) for reducing or preventing electron transport, an electron injection layer (EIL) for facilitating electron injection, an electron transport layer (ETL) for facilitating electron transport, and a hole blocking layer (HBL) for reducing or preventing hole transport.

The auxiliary layer 212 may include, for example an organic material, an inorganic material, or an organic/inorganic material. The organic material may be an organic compound having hole or electron characteristics, and the inorganic material may be a metal oxide such as molybdenum oxide, tungsten oxide, or nickel oxide, but are not limited thereto.

The optical filter 300 is disposed on the visible light sensor 100 and the near infra-red light sensor 200, e.g., at the incident light side 401 of the sensor 400 and is disposed on a whole ("entire") surface of the visible light sensor 100 and the near infra-red light sensor 200. For example, a top surface of the optical filter 300 may define an entirety of the incident light side 401 of the sensor 400, such that a top surface 300S of the optical filter 300 defines the incident light side 401 of the sensor 400, as shown in FIG. 5. The specific description of the optical filter 300 is the same as described above.

In some example embodiments, the semiconductor substrate 110 is between the optical filter 300 and the near infra-red light sensor 200, such that the visible light sensor 100 is between the optical filter 300 and the near infra-red light sensor 200.

A focusing lens (not shown) may be further formed on an upper or lower surface of the optical filter 300. The focusing lens may control a direction of incident light and gather the light in one region. The focusing lens may have a shape of, in some example embodiments, a cylinder or a hemisphere, but is not limited thereto.

Figure 6:
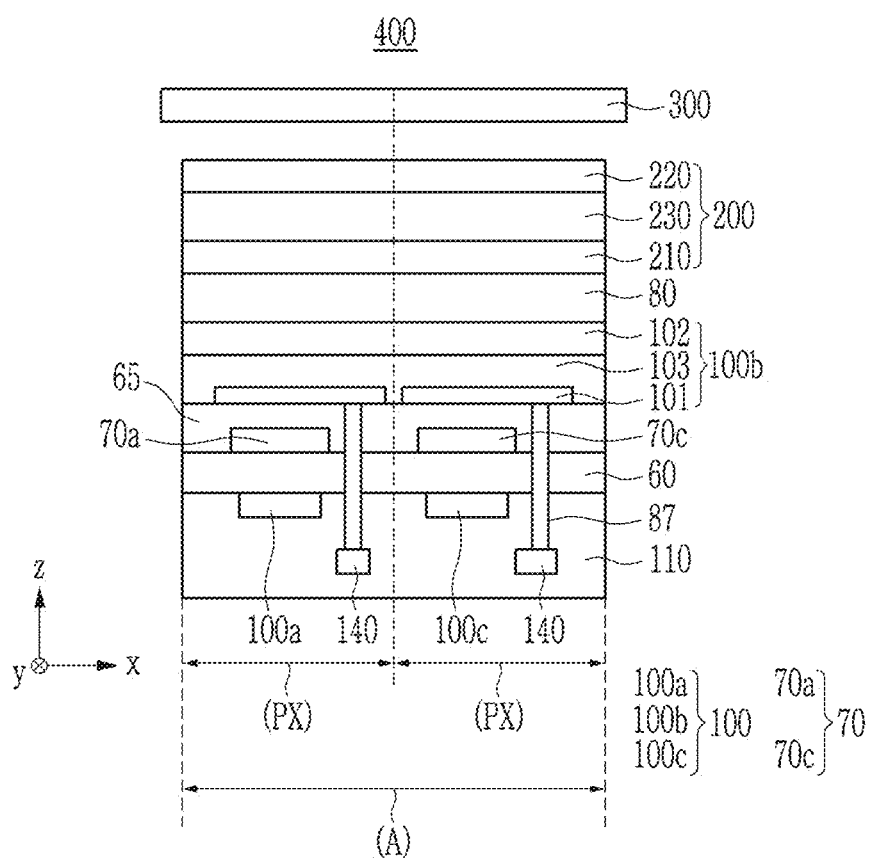
FIG. 6 is a cross-sectional view that schematically shows an example of a sensor according to some example embodiments.

FIG. 6 is a cross-sectional view that schematically shows another example of a sensor according to some example embodiments.

Referring to FIG. 6, the sensor 400 according to some example embodiments includes the visible light sensor 100, the near infra-red light sensor 200, and the optical filter 300 as described above.

Referring to FIG. 6, in the sensor 400 according to some example embodiments, the visible light sensor 100 may be a combination of a photodiode integrated in the semiconductor substrate 110 and a photoelectric device disposed on the semiconductor substrate 110, and the near infra-red light sensor 200 may be a separate photoelectric device. In some example embodiments, the same illustration as FIG. 5 will not be repeated, and accordingly, a description of the same constituent elements as those of FIG. 5 will be omitted.

In the semiconductor substrate 110, the blue sensor 100a, the red sensor 100b, the charge storage 130, and a transmission transistor (not shown) are integrated. The blue sensor 100a and the red sensor 100b are photodiodes and spaced apart from each other in a horizontal direction of the semiconductor substrate 110. The blue sensor 100a is integrated in a blue pixel, and the red sensor 100b is integrated in a red pixel.

On the semiconductor substrate 110, the lower insulation layer 60 and the color filter layer 70 are formed. The color filter layer 70 includes a blue filter 70a overlapped with the blue sensor 100a and a red filter 70c overlapped with the red sensor 100c.

An intermediate insulation layer 65 is formed on the color filter layer 70. The lower insulation layer 60 and the intermediate insulation layer 65 may have a trench 87 exposing the charge storage 140. The trench 87 may be filled with fillers. At least one of the lower insulation layer 60 and intermediate insulation layer 65 may be omitted.

On the intermediate insulation layer 65, the green sensor 100b is formed. The green sensor 100b may be a photoelectric device and formed at the whole surface of the sensor 400. The green sensor 100b includes a lower electrode 101 and an upper electrode 102 facing each other, and a green light absorption layer 103 between lower electrode 101 and upper electrode 102. One of the lower electrode 101 and the upper electrode 102 is an anode and the other is a cathode.

Both of the lower electrode 101 and the upper electrode 102 may be a light-transmitting electrode, and the light-transmitting electrode may be made of, in some example embodiments, a transparent conductor such as indium tin oxide (ITO) or indium zinc oxide (IZO), or may be a metal thin layer having a thin thickness of several nanometers or several tens of nanometers or a metal thin layer having a thin thickness of several nanometers to several tens of nanometers doped with a metal oxide.

The green light absorption layer 103 may be configured to selectively absorb light in a green wavelength region, and may be configured to transmit light in a wavelength region other than the green wavelength region, that is, a blue wavelength region and a red wavelength region.

The green light absorption layer 103 may include, for example a p-type semiconductor and an n-type semiconductor and the p-type semiconductor and the n-type semiconductor may form a pn junction. At least one of the p-type semiconductor and the n-type semiconductor may selectively absorb light in a green wavelength region and may selectively absorb light in a green wavelength region to generate excitons, and then generated excitons may be separated into holes and electrons to provide a photoelectric effect. The green light absorption layer 103 may replace the green filter.

The p-type semiconductor and the n-type semiconductor may independently have an energy bandgap of about 2.0 eV to about 2.5 eV and the semiconductor and the n-type semiconductor may have a LUMO difference of about 0.2 eV to about 0.7 eV.

The green light absorption layer 103 may be a single layer or a multilayer. The green light absorption layer 103 may have for example various combinations of an intrinsic layer (I layer), a p-type layer/I layer, a I layer/n-type layer, a p-type layer/I layer/n-type layer, or a p-type layer/n-type layer.

The green light absorption layer 103 may be formed at a whole surface of the sensor 400. Accordingly, the light of the green wavelength range may be configured to be selectively absorbed from the whole surface of the sensor 400 and thus the light absorption area may be increased to have high absorption efficiency.

The green light absorption layer 103 may selectively absorb the light in a green wavelength region to generate excitons, then generated excitons may be separated into holes and electrons, and then separated holes transfer to an anode that is one of the lower electrode 101 and the upper electrode 102 and separated electrons transfer to a cathode that is one of the lower electrode 101 and the upper electrode 102 to provide a photoelectric conversion effect. The separated electrons and/or holes may be collected in the charge storage 140.

An auxiliary layer (not shown) may be further disposed between the lower electrode 101 and the green light absorption layer 103 and/or between the upper electrode 102 and the green light absorption layer 103. The auxiliary layer may be a charge auxiliary layer, a light-absorbing auxiliary layer, or a combination thereof, but is not limited thereto.

Herein, in some example embodiments, the blue sensor 100a and the red sensor 100c are photodiodes and the green sensor 100b is a photoelectric device. However, the blue sensor 100a and the green sensor 100b may be photodiodes and the red sensor 100c may be a photoelectric device or the green sensor 100b and the red sensor 100c may be photodiodes and the blue sensor 100a may be a photoelectric device. Restated, two sensors of the blue sensor 100a, the green sensor 100b, and the red sensor 100c may be photodiodes integrated in the semiconductor substrate 110 and a remaining one sensor of the blue sensor 100a, the green sensor 100b, and the red sensor 100c may be a photoelectric device on the semiconductor substrate 110. Similarly to the green sensor 100b as shown in FIG. 6, the photoelectric device may include a pair of electrodes facing each other (e.g., 101 and 102) and a visible absorption layer (e.g., 103) between the pair of electrodes, where the visible absorption layer is configured to absorb light in one wavelength spectrum of a blue wavelength spectrum, a green wavelength spectrum, and a red wavelength spectrum.

On the green sensor 100b, an upper insulation layer 80 is formed, and on the upper insulation layer 80, a near infra-red light sensor 200 and an optical filter 300 are disposed. The near infra-red light sensor 200 and the optical filter 300 are the same as described above.

The sensor 400 according to some example embodiments is a combination sensor equipped with the visible light sensor 100 and the near infra-red light sensor 200 stacked each other, and the visible light sensor 100 also has a structure of stacking a photodiode and a photoelectric device and thus may further reduce an area of the sensor and realize down-sizing of the sensor.

Figure 7:
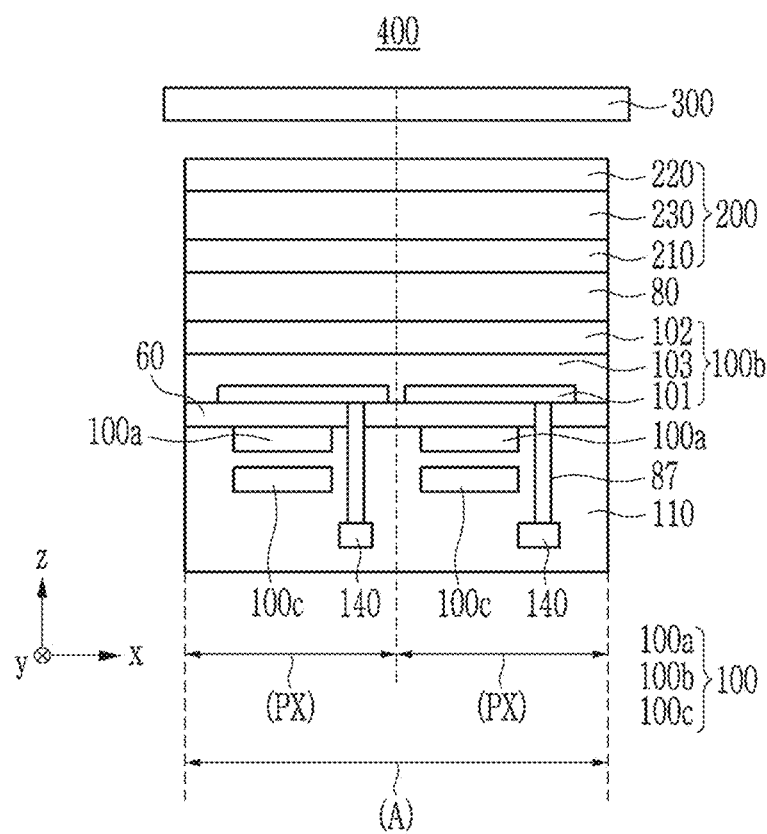
FIG. 7 is a cross-sectional view that schematically shows an example of a sensor according to some example embodiments.

FIG. 7 is a cross-sectional view that schematically shows another example of a sensor according to some example embodiments.

Referring to FIG. 7, the sensor 400 according to some example embodiments includes the visible light sensor 100, the near infra-red light sensor 200, and the optical filter 300 like that of some example embodiments. The visible light sensor 100 includes the blue sensor 100a and the red sensor 100c integrated in the semiconductor substrate 110 and a green sensor 100b disposed on the semiconductor substrate 110, wherein the blue sensor 100a and the red sensor 100c may be photodiodes, and the green sensor 100b may be a photoelectric device. The near infra-red light sensor 200 may be a photoelectric device. The green sensor 100b includes a lower electrode 101, a green light absorption layer 103, and an upper electrode 102, and the near infra-red light sensor 200 includes a lower electrode 210, a near infra-red absorption layer 230, and an upper electrode 220.

However, in the sensor 400 according to some example embodiments, the blue sensor 100a and the red sensor 100c integrated in the semiconductor substrate 110 are stacked in a vertical direction. The blue sensor 100a and the red sensor 100c may be configured to selectively absorb light in each wavelength region depending on a stacking depth and thus sense it. In other words, the red sensor 100c configured to absorb red light in a long wavelength region is disposed deeper from the surface of the semiconductor substrate 110 than the blue sensor 100a configured to absorb blue light in a short wavelength region. In this way, the color filter layer 70 may be omitted by separating absorption wavelengths depending on the stacking depth.

Herein, in some example embodiments, the blue sensor 100a and the red sensor 100c are photodiodes and the green sensor 100b is a photoelectric device.

However, the blue sensor 100a and the green sensor 100b may be photodiodes and the red sensor 100c may be a photoelectric device or the green sensor 100b and the red sensor 100c may be photodiodes and the blue sensor 100a may be a photoelectric device.

The sensor 400 according to some example embodiments is a combination sensor equipped with the visible light sensor 100 and the near infra-red light sensor 200 stacked each other, the visible light sensor 100 is also equipped with a photodiode and a photoelectric device stacked each other, and the photodiode also has a stacking structure and accordingly, may further reduce an area of the sensor and thus realize down-sizing of the sensor. In addition, the sensor 400 according to some example embodiments includes no separate color filter layer and thus may simplify a structure and a process.

The aforementioned sensor is a combination sensor simultaneously having an image sensor function and a biometric sensor function and accordingly, may be applied to various electronic devices, in some example embodiments, a mobile phone, a digital camera, a biometric device, an auto electronic part, and the like but is not limited thereto.

Figure 8:
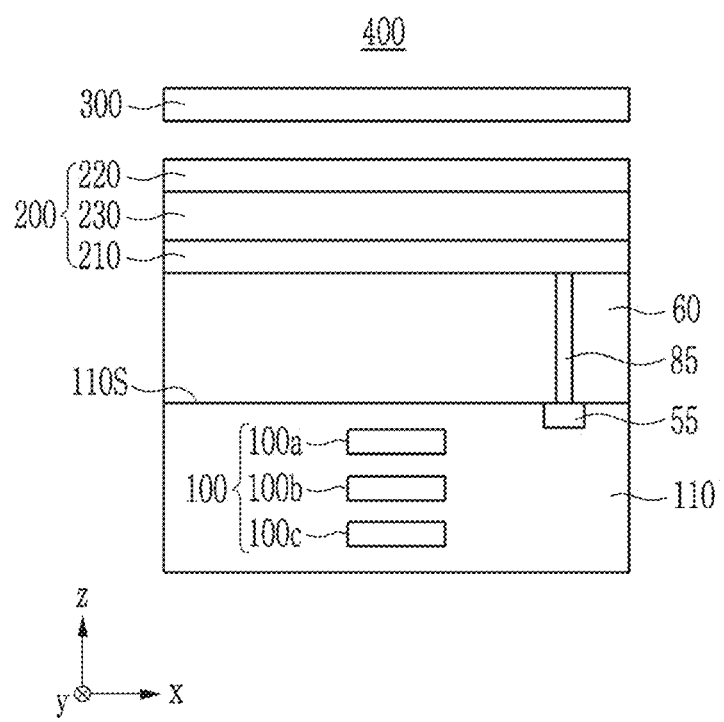
FIG. 8 is a cross-sectional view showing a sensor according to some example embodiments.

FIG. 8 is a cross-sectional view showing a sensor 400 according to some example embodiments.

As shown in FIG. 8, a sensor 400 according to some example embodiments includes a semiconductor substrate 110 integrated with a visible light sensor 100 that include sensors (e.g., diodes) 100a, 100b, and 100c, a transmission transistor (not shown), and a charge storage 55, an insulation layer 60 having a trench 85, a near infra-red light sensor 200, and an optical filter 300. The near infra-red light sensor 200 shown in FIG. 8 may be any of the example embodiments of near infra-red light sensor 200 described herein with regard to FIGS. 1-7.

In the sensor 400 according to some example embodiments, the sensors 100a, 100b, and 100c (which may each be configured to sense a different wavelength region of visible light) are stacked in a vertical direction and the color filter layer 70 is omitted. The sensors 100a, 100b, and 100c are electrically connected to charge storage (not shown) and may be transferred by the transmission transistor. The sensors 100a, 100b, and 100c may selectively absorb light in separate, respective wavelength spectra of light depending on a stack depth of the respective sensors 100a, 100b, and 100c. Other structures are the same as the sensor of FIG. 5.

Figure 9:
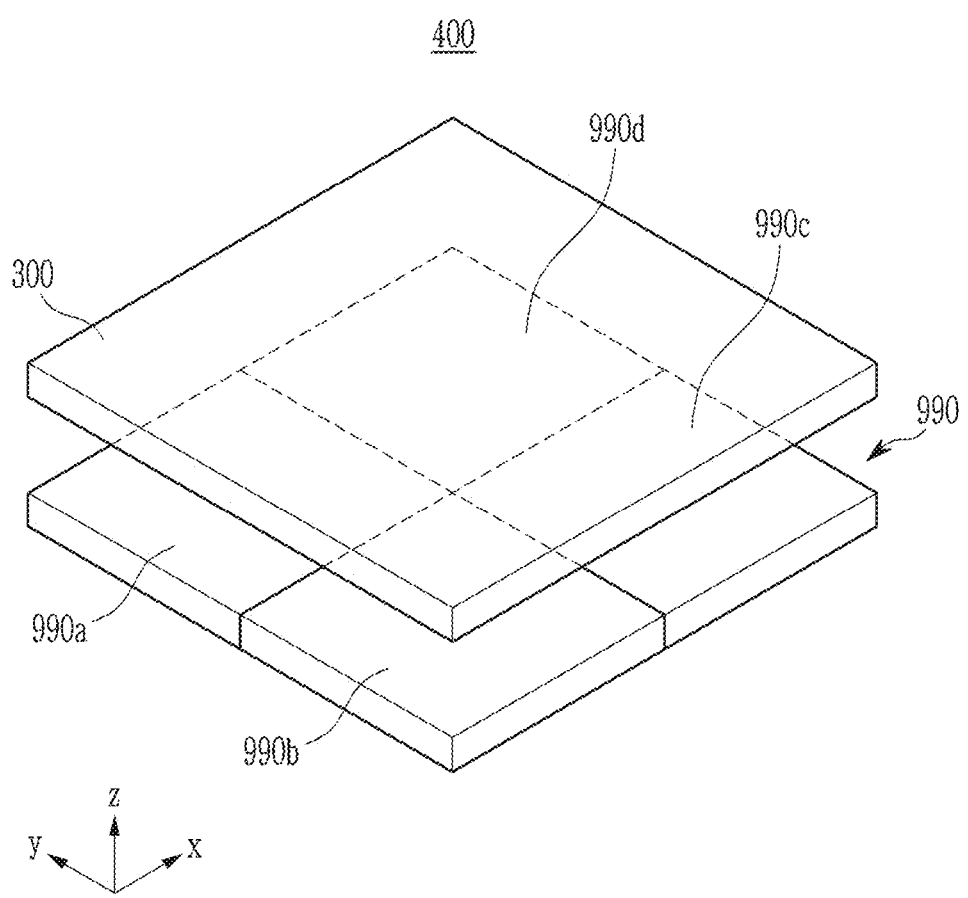
FIG. 9 is a perspective view of a sensor according to some example embodiments.
Figure 10:
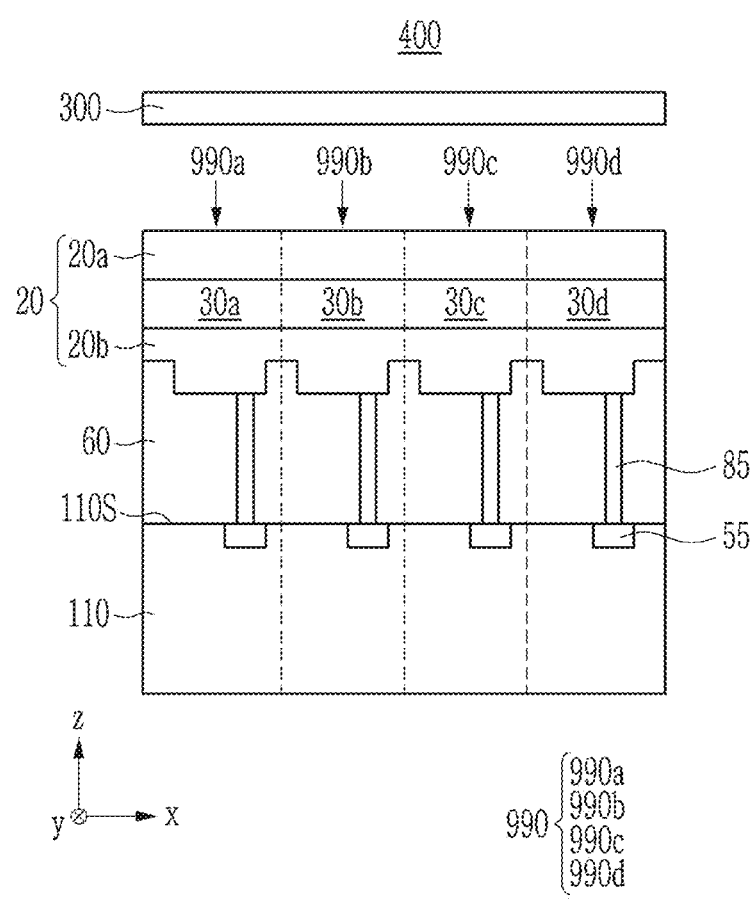
FIG. 10 is a schematic cross-sectional view showing the sensor of FIG. 9 according to some example embodiments.

FIG. 9 is a perspective view of a sensor 400 according to some example embodiments. FIG. 10 is a schematic cross-sectional view showing the sensor of FIG. 9, according to some example embodiments.

As shown with reference to FIG. 10, a sensor 400 may include a photoelectric diode 990 that includes a plurality of photoelectric diodes 990a, 990b, 990c, and 990d on a semiconductor substrate 110, where the plurality of photoelectric diodes 990a, 990b, 990c, and 990d are configured to absorb and convert different ones of blue light, green light, red light, or infrared light (i.e., different wavelength spectra of incident light) into electric signals, respectively, and where the optical filter 300 may be stacked on the photoelectric diode 990 in the vertical direction (e.g., Z-direction). It will be understood that, as shown in FIGS. 9-10, the sensor 400 may include a plurality of photoelectric diodes 990a-990d that are stacked horizontally on the semiconductor substrate 110, such that the plurality of photoelectric diodes 990a-990d overlap each other in a direction extending parallel to a top surface 110S of the semiconductor substrate 110.

Referring to FIG. 10, a sensor 400 according to some example embodiments includes a semiconductor substrate 110 integrated with charge storages 55, transmission transistors (not shown), an insulation layer 60, an optical filter 300, and photoelectric diodes 990a, 990b, 990c, and 990d.

As shown with reference to FIGS. 9-10, a sensor 400 may include a photoelectric diode 990 that itself includes a plurality of photoelectric diodes 990a, 990b, 990c, and 990d on a semiconductor substrate 110, where the plurality of photoelectric diodes 990a, 990b, 990c, and 990d are configured to absorb and convert different ones of blue light, green light, red light, or infrared light (i.e., different wavelength spectra of incident light) into electric signals, respectively. As shown in FIG. 10, the separate photoelectric diodes 990a, 990b, 990c, and 990d may be horizontally arranged on the semiconductor substrate 110 such that the photoelectric diodes 990a, 990b, 990c, and 990d are partially or entirely overlapped with each other in a direction that extends in parallel with a top surface 110S of the semiconductor substrate 110 (e.g., the X-direction and/or Y-direction). As shown, each separate photoelectric diode 990a, 990b, 990c, and 990d is connected to a separate charge storage 55 that is integrated into the semiconductor substrate 110 via a separate trench 85.

Each photoelectric diode 990a, 990b, 990c, and 990d may be any one of the photoelectric diodes described herein with reference to FIGS. 1-8. In some example embodiments, separate photoelectric diodes 990a, 990b, 990c, and 990d may include different portions of a common, continuous layer that extends continuously between two or more of the photoelectric diodes 990a, 990b, 990c, and 990d. As shown in FIG. 10, for example, the photoelectric diodes 990a-990d include separate portions of a photoelectric device 20 that includes opposite electrodes 20a and 20b and one or more photoelectric conversion layers 30a-30d between the electrodes 20a and 20b. In some example embodiments, including the example embodiments shown in FIG. 10, the photoelectric diodes 990a, 990b, 990c, and 990d may share one or more common electrodes 20a and/or 20b. In another example, two or more of the photoelectric diodes 990a, 990b, 990c, and 990d may have different photoelectric conversion layers 30a, 30b, 30c, and 30d that are configured to absorb different wavelength spectra of incident light. Other structures are the same as the sensor 400 of FIG. 5.

Figure 11:
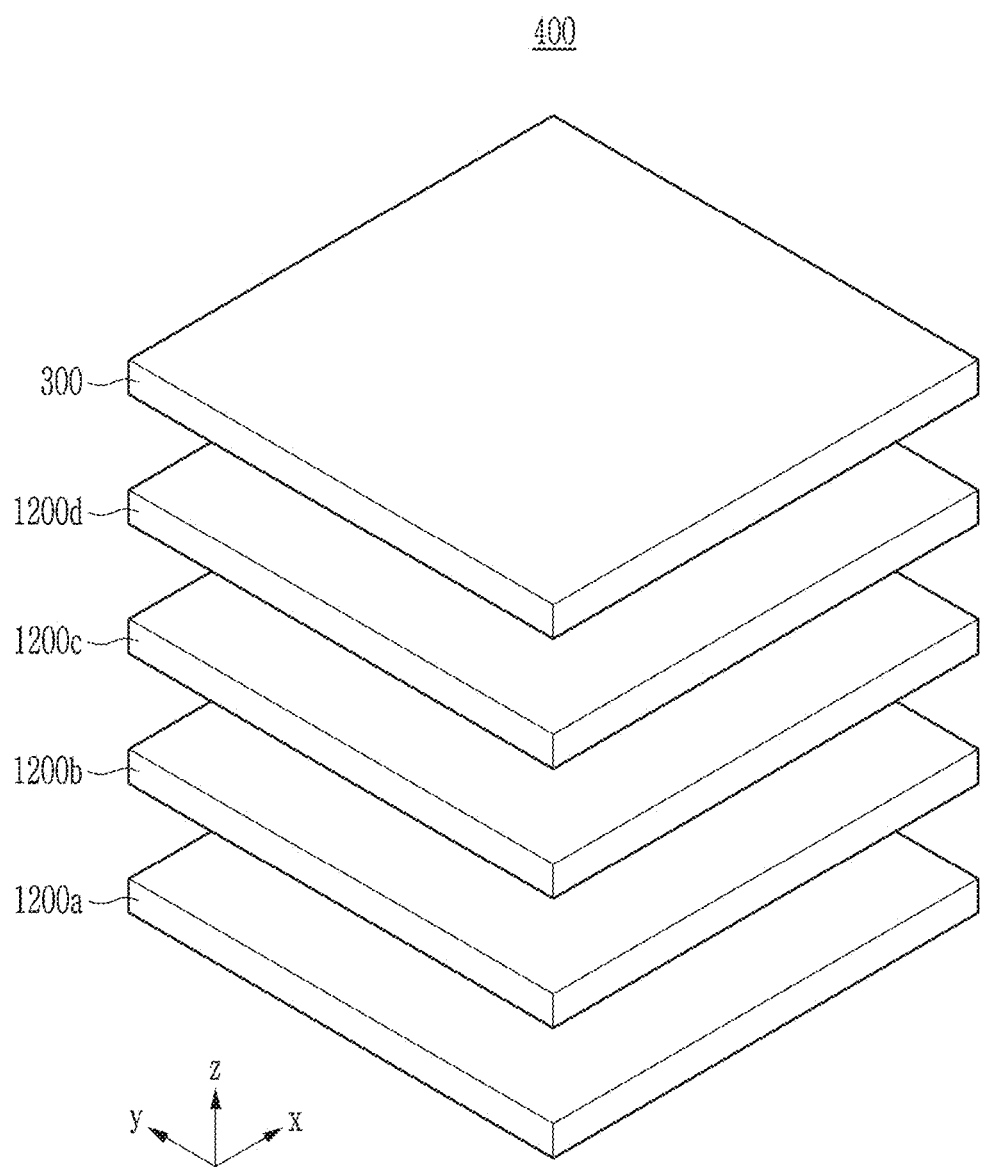
FIG. 11 is a perspective view of a sensor according to some example embodiments.
Figure 12:
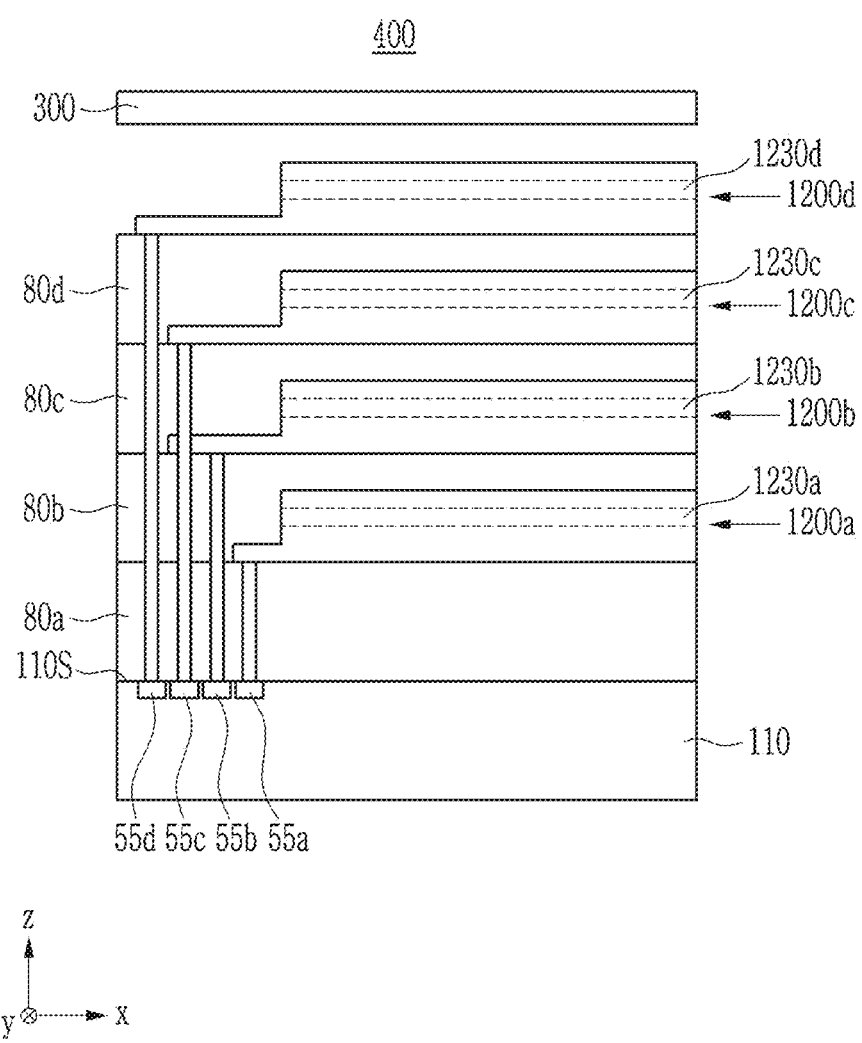
FIG. 12 is a schematic cross-sectional view showing the sensor of FIG. 11 according to some example embodiments.

FIG. 11 is a perspective view of a sensor according to some example embodiments, and FIG. 12 is a schematic cross-sectional view showing the sensor of FIG. 11 according to some example embodiments.

Referring to FIGS. 11-12, the sensor 400 according to some example embodiments includes an optical filter, an infrared/near infrared photoelectric diode configured to selectively absorb light in an infrared/near infrared wavelength spectrum of light, a red photoelectric diode configured to selectively absorb and convert (into electric signals) light in a red wavelength spectrum of incident light, a green photoelectric diode configured to selectively absorb and convert (into electric signals) light in a green wavelength spectrum of incident light, a blue photoelectric diode configured to selectively absorb and convert (into electric signals) light in a blue wavelength spectrum of incident light, and they are stacked in the vertical direction (e.g., Z-direction). Accordingly, it will be understood that, as shown in FIGS. 11-12, the sensor 400 may include a plurality of photoelectric diodes 1200a-1200d that are stacked vertically on the semiconductor substrate 110, such that the plurality of photoelectric diodes 1200a-1200d overlap each other in a direction extending perpendicular to a top surface 110S of the semiconductor substrate 110.

The sensor 400 according to some example embodiments includes a semiconductor substrate 110, a lower insulation layer 80a, an intermediate insulation layer 80b, another intermediate insulation layer 80c, an upper insulation layer 80d, a first photoelectric diode 1200a, a second photoelectric diode 1200b, a third photoelectric diode 1200c, and a fourth photoelectric diode 1200d. As shown, the first to fourth photoelectric diode 1200a to 1200d are stacked vertically on the semiconductor substrate 110, such that the first to fourth photoelectric diode 1200a to 1200d overlap each other in a direction extending perpendicular to a top surface 110S of the semiconductor substrate 110.

The semiconductor substrate 110 may be a silicon substrate, and is integrated with the transmission transistor (not shown) and charge storages.

The first photoelectric diode 1200a is formed on the lower insulation layer 80a. The first photoelectric diode 1200a includes a photoelectric conversion layer 1230a. The first photoelectric diode 1200a may be any one of the photoelectric diodes described herein with reference to FIGS. 1-7. The photoelectric conversion layer 1230a may selectively absorb and convert (into electric signals) light in one of infrared, red, blue, and green wavelength spectra of incident light. For example, the first photoelectric diode 1200a may be a blue photoelectric diode.

An intermediate insulation layer 80b is formed on the first photoelectric diode 1200a.

The second photoelectric diode 1200b is formed on the intermediate insulation layer 80b. The second photoelectric 1200b includes a photoelectric conversion layer 1230b. The second photoelectric diode 1200b may be any one of the photoelectric diodes described herein with reference to FIGS. 1-7. The photoelectric conversion layer 1230b may selectively absorb and convert (into electric signals) light in one of infrared, red, blue, and green wavelength spectra of incident light. For example, the second photoelectric diode 1200b may be a green photoelectric diode.

Another intermediate insulation layer 80c is formed on the second photoelectric diode 1200b.

The third photoelectric diode 1200c is formed on the intermediate insulation layer 80c. The third photoelectric diode 1200c includes a photoelectric conversion layer 1230c. The third photoelectric diode 1200c may be any one of the photoelectric diodes described herein with reference to FIGS. 1-7. The photoelectric conversion layer 1230c may selectively absorb and convert (into electric signals) light in one of infrared, red, blue, and green wavelength spectra of incident light. For example, the third photoelectric diode 1200c may be a red photoelectric diode.

The upper insulation layer 80d is formed on the third photoelectric diode 1200c.

The lower insulation layer 80a, the intermediate insulation layers 80b and 80c, and the upper insulation layer 80d have a plurality of through-holes exposing the charge storages 55a, 55b, 55c, and 55d.

The fourth photoelectric diode 1200d is formed on the upper insulation layer 80d. The fourth photoelectric diode 1200d includes a photoelectric conversion layer 1230d. The fourth photoelectric diode 1200d may be any one of the photoelectric diodes described herein with reference to FIGS. 1-7. The photoelectric conversion layer 1230d may selectively absorb light in one of infrared, red, blue, and green wavelength spectra of light. For example, the fourth photoelectric diode 1200d may be an infrared/near infrared photoelectric diode.

As shown, an optical filter 300 may be on the fourth photoelectric diode 1200d.

In the drawing, the first photoelectric diode 1200a, the second photoelectric diode 1200b, the third photoelectric diode 1200c, and the fourth photoelectric diode 1200d are sequentially stacked, but the present disclosure is not limited thereto, and they may be stacked in various orders.

As described above, the first photoelectric diode 1200a, the second photoelectric diode 1200b, the third photoelectric diode 1200c, and the fourth photoelectric diode 1200d have a stack structure, and thus the size of an image sensor may be reduced to realize a down-sized image sensor.

Figure 13:
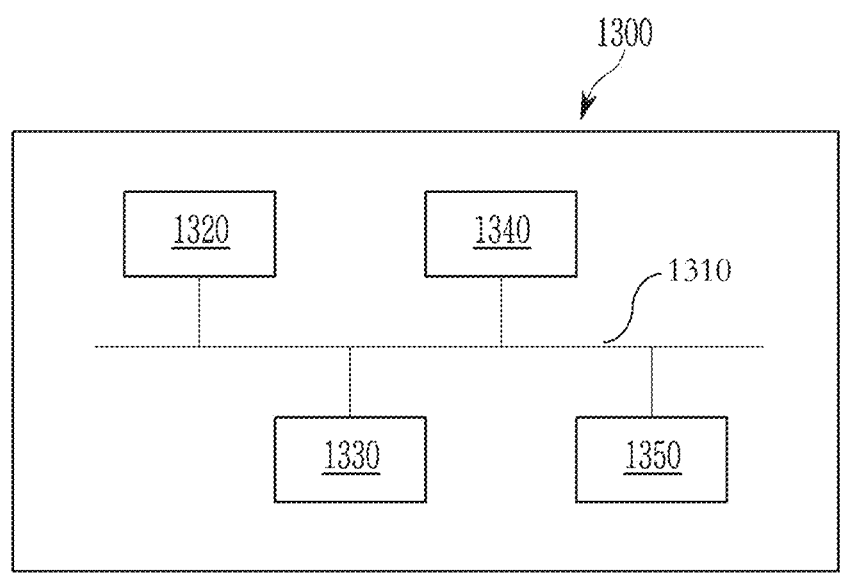
FIG. 13 is a schematic diagram of an electronic device according to some example embodiments.

FIG. 13 is a schematic diagram of an electronic device 1300 according to some example embodiments.

As shown in FIG. 13, an electronic device 1300 may include a processor 1320, a memory 1330, image sensor device 1340, and display device 1350 that are electrically coupled together via a bus 1310. The image sensor device 1340 may include any of the sensors 400 of any of the example embodiments as described herein. The memory 1330, which may be a non-transitory computer readable medium, may store a program of instructions. The processor 1320 may execute the stored program of instructions to perform one or more functions. The processor 1320 may further may execute the stored program of instructions to display the generated image on display device 1350. The processor 1320 may be configured to generate an output (e.g., an image to be displayed on the display device 1350).

Hereinafter, some example embodiments are illustrated in more detail with reference to examples. However, the present disclosure is not limited to the example embodiments.
Color Simulation Evaluation Example 1

A structure of a sensor shown in FIGS. 1, 2, and 5 is designed, and characteristics of a color image of a visible light sensor are examined. A near infra-red absorption layer of a near infra-red light sensor is formed by applying a near infra-red light absorbing material represented by Chemical Formula A, and light absorption characteristics thereof are evaluated through DFT and TD-DFT calculation simulations (wB97X-D/6-311G** basis set) by using a Gaussian 09 program.

[Chemical Formula A]

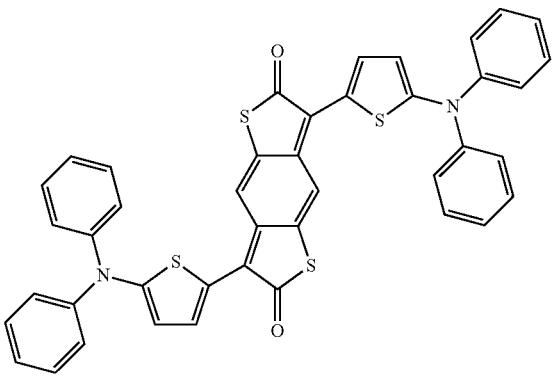

Figure 14:
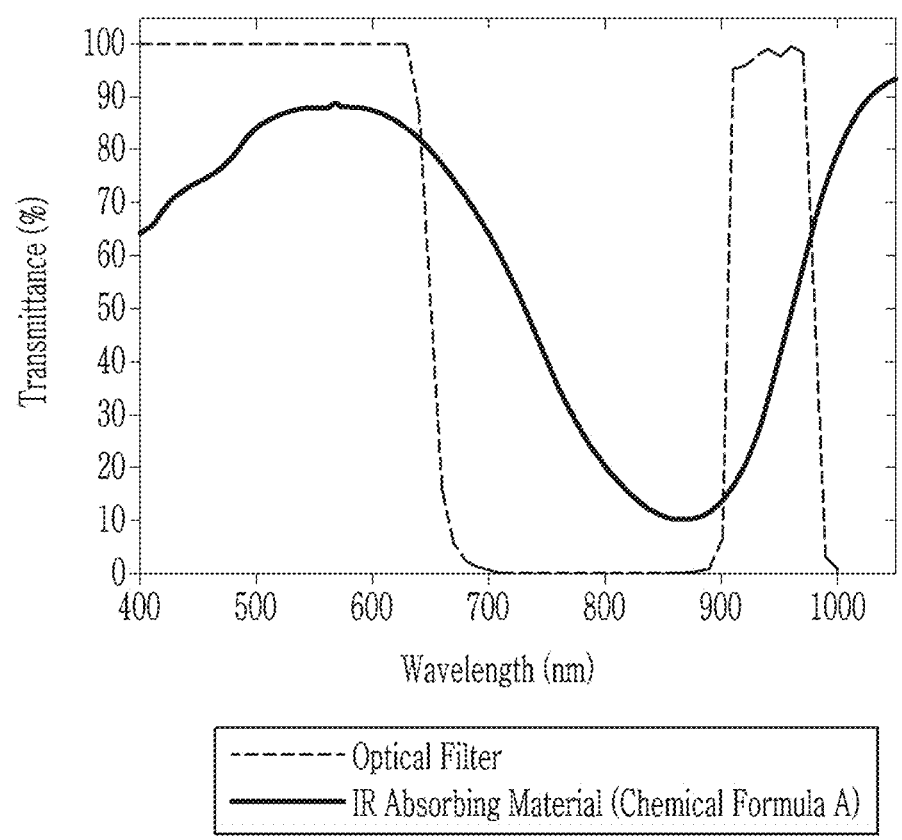
FIG. 14 is a transmission spectrum of the optical filter and the near infra-red light sensor of the sensor according to Example 1 according to some example embodiments.

Transmission spectra of an optical filter and the near infra-red light sensor are shown in FIG. 14.

FIG. 14 is the transmission spectra of the optical filter and the near infra-red light sensor of the sensor according to Example 1 according to some example embodiments.

Comparative Example 1

A color image change is examined by manufacturing a sensor having the same structure as Example 1 except that the optical filter is not included.
Evaluation I FIG. 15 is a graph showing external quantum efficiency depending on a wavelength of the visible light sensor of the sensor according to Example 1 according to some example embodiments, and FIG. 16 is a graph showing external quantum efficiency depending on a wavelength of the visible light sensor of the sensor according to Comparative Example 1 according to some example embodiments.

Figure 15:
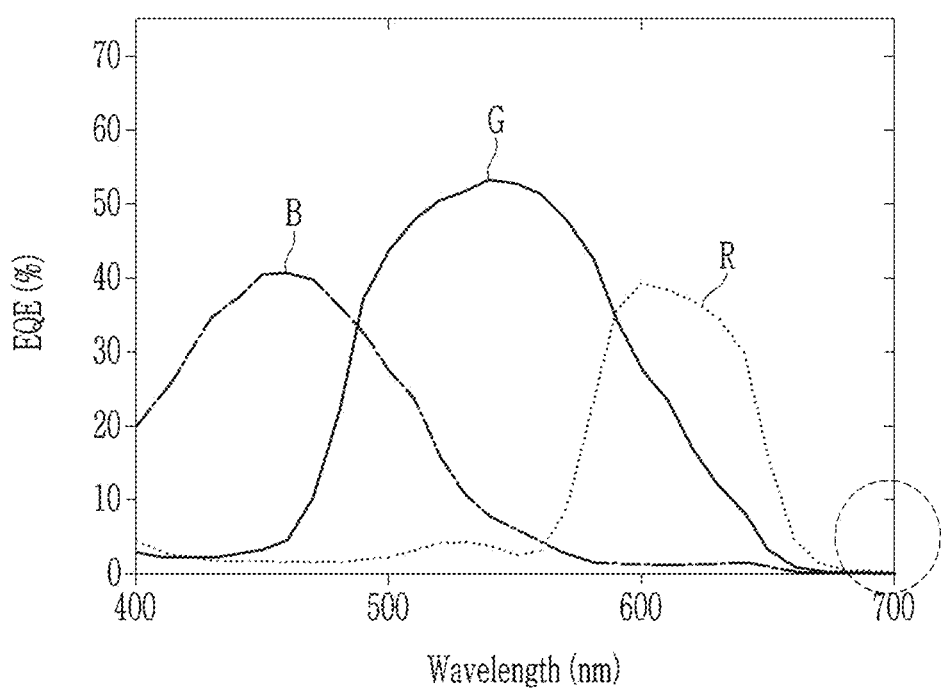
FIG. 15 is a graph showing external quantum efficiency depending on a wavelength of the visible light sensor of the sensor according to Example 1 according to some example embodiments.
Figure 16:
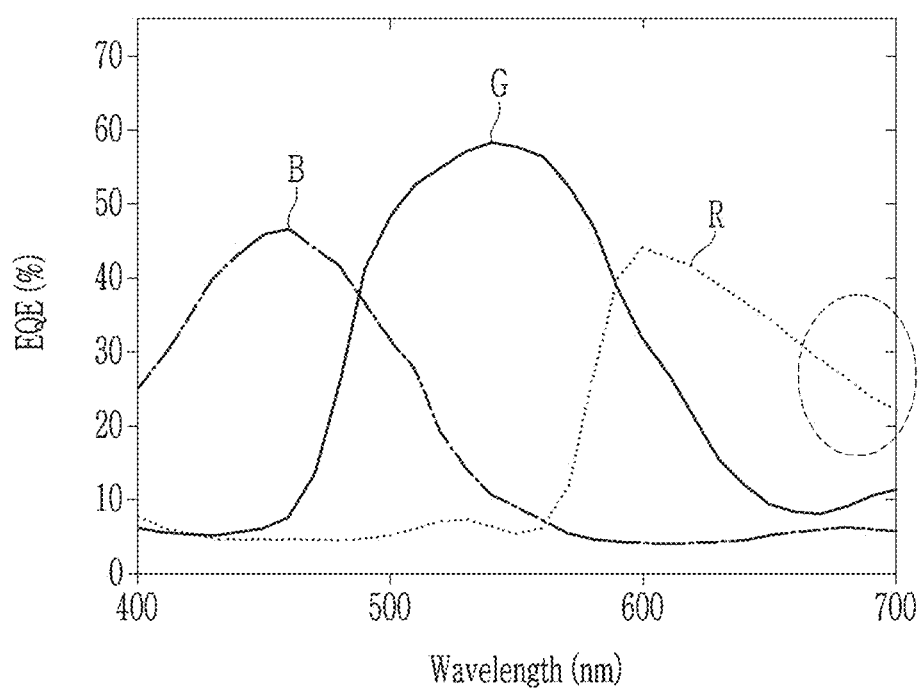
FIG. 16 is a graph showing external quantum efficiency depending on a wavelength of the visible light sensor of the sensor according to Comparative Example 1 according to some example embodiments.

Comparing FIG. 15 with FIG. 16, the sensor of Example 1 shows clear spectral characteristics around about 700 nm, a boundary between a visible region and a near infra-red region, but the sensor of Comparative Example 1 shows low wavelength selectivity around about 700 nm.

Color image characteristics of the sensor are evaluated by YSNR10 and a color difference.

YSNR10 of the sensor is a minimum light dose (a unit: lux) where a signal/noise ratio is 10, wherein the signal indicates sensitivity of the signal obtained by color-correcting a RGB raw signal calculated in a FDTD (finite difference time domain) method through a color correction matrix (CCM), and the noise is a noise generated when the signal of the image sensor is measured. The color correction is a process of image-processing the RGB raw signal obtained from the sensor and thus reducing a difference from an actual color. The smaller YSNR10 is, the better the image characteristics at a small light dose are.

The color difference ($\Delta E^*_{ab}$) of the sensor may be expressed as a distance within $CIE_{LAB}$ color space to quantify a difference between two colors according to the following relationship equation.

$$\Delta E^*_{ab} = \sqrt{\Delta L^{*2} + \Delta a^{*2} + \Delta b^{*2}} \quad \text{[relationship equation]}$$

In the above relationship equation, $\Delta E^*_{ab}$ is a color difference,

L* is brightness, a* is hue and chroma to red and green directions, and b* is hue and chroma to blue and yellow directions.

YSNR10 and color differences are described in Table 1.

TABLE 1

|  | YSNR10 | $\Delta E^*_{ab}$ |
|---|---|---|
| Example 1 | 135 | 5.7 |
| Comparative Example 1 | 140 | 5.9 |

Referring to Table 1, the sensor of Example 1 exhibits decreased YSNR10 and color difference compared with those of the sensor of Comparative Example 1, and accordingly, color image characteristics of the sensor is expected to be improved.

Examples 2 to 4

The structure of the sensor shown in FIGS. 1, 2, and 5 is designed, and a color image change of a visible light sensor is examined. A near infra-red absorption layer is formed by applying a near infra-red ray light absorbing material represented by Chemical Formula B, and light absorption characteristics thereof are evaluated through DFT and TD-DFT calculation simulations (wB97X-D/6-311G** basis set) by using a Gaussian 09 program.

[Chemical Formula B]

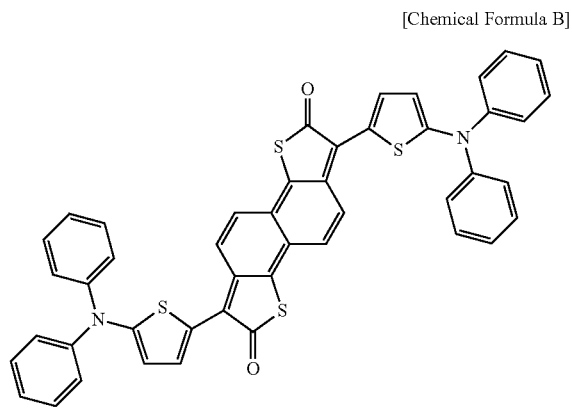 [SMILES: O=C1Sc2c(ccc3c4c(ccc23)=C(c2ccc(N(c3ccccc3)c3ccccc3)s2)C(=O)S4)=C1c1ccc(N(c2ccccc2)c2ccccc2)s1]

Figure 17:
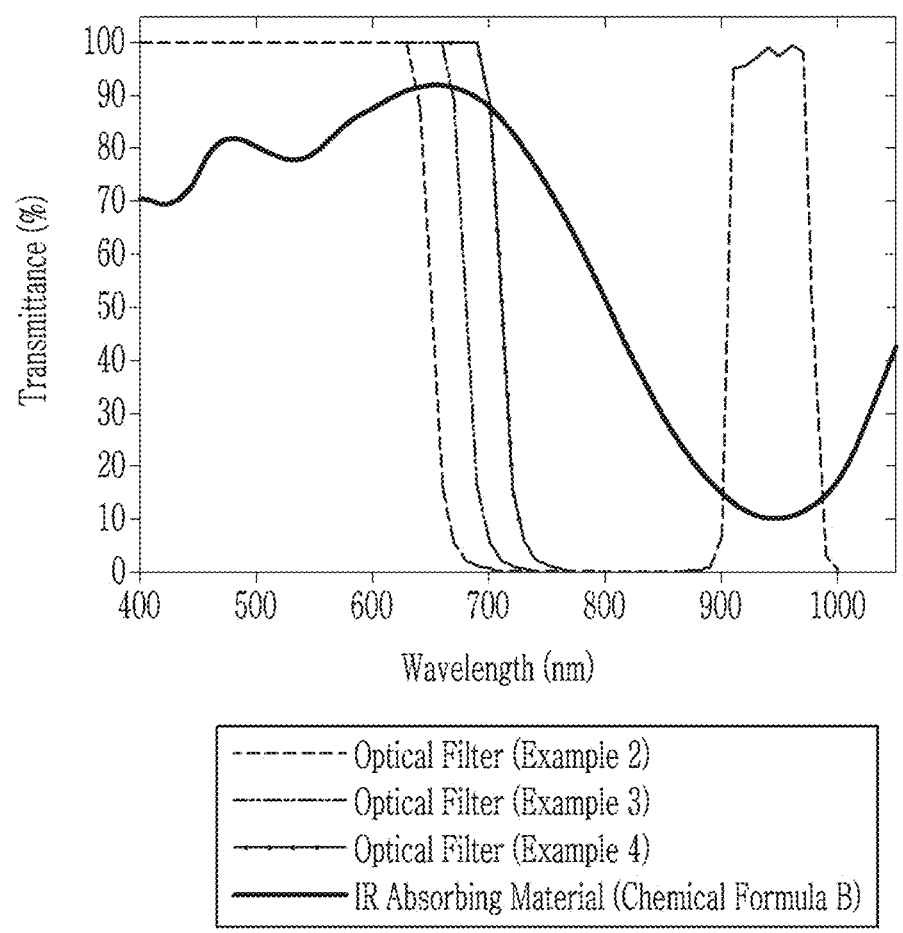
FIG. 17 shows transmission spectra of the optical filter and near infra-red light sensor of the sensor according to Example 2 to 4 according to some example embodiments.

Transmission spectra of an optical filter and a near infra-red light sensor are shown in FIG. 17.

FIG. 17 shows the transmission spectra of the optical filters and the near infra-red light sensors of the sensors according to Example 2 to 4 according to some example embodiments.

Comparative Example 2

A color image change is examined by manufacturing a sensor having the same structure as Example 2 except that the optical filter is not included.
Evaluation II FIG. 18 is a graph showing external quantum efficiency depending on a wavelength of the visible light sensor of the sensor according to Example 2 according to some example embodiments, and FIG. 19 is a graph showing external quantum efficiency depending on a wavelength of the visible light sensor of the sensor according to Comparative Example 2 according to some example embodiments.

Figure 18:
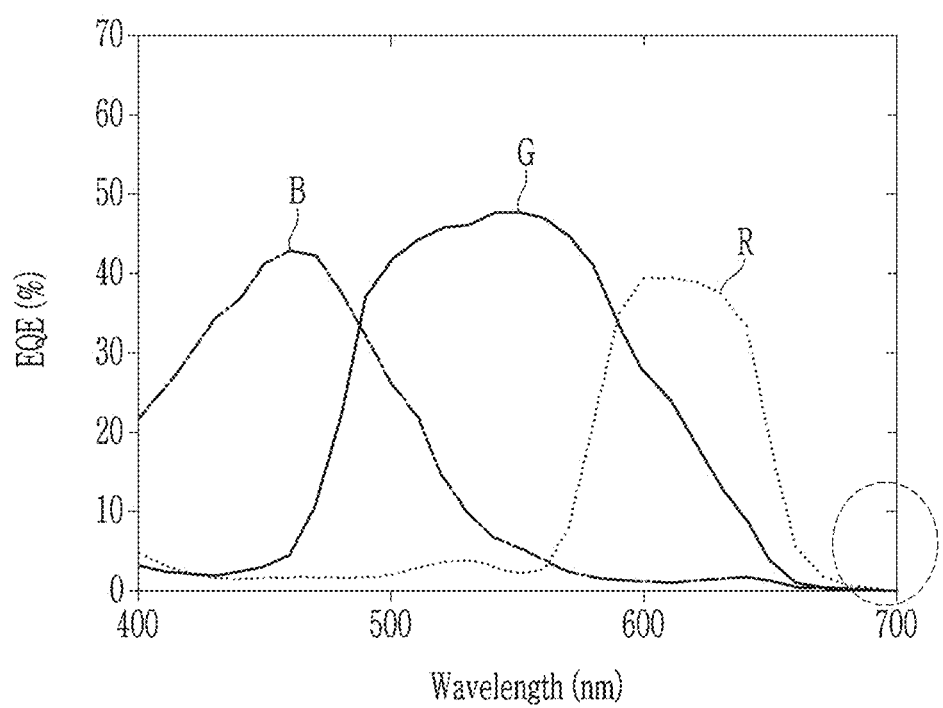
FIG. 18 is a graph showing external quantum efficiency depending on a wavelength of the visible light sensor of the sensor according to Example 2 according to some example embodiments.
Figure 19:
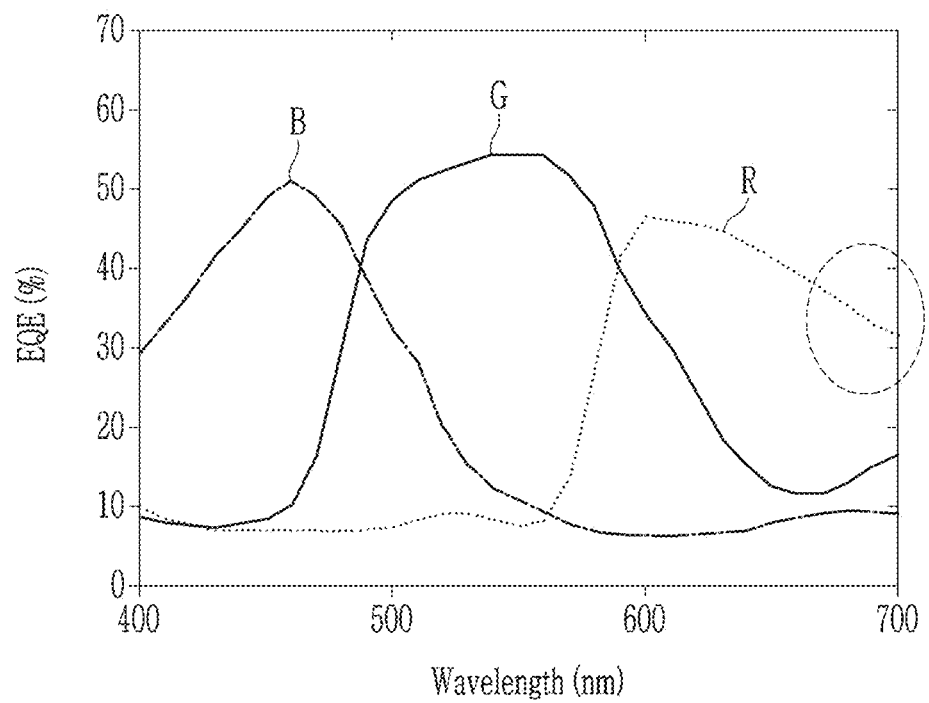
FIG. 19 is a graph showing external quantum efficiency depending on a wavelength of the visible light sensor of the sensor according to Comparative Example 2 according to some example embodiments.

Comparing FIG. 18 with FIG. 19, the sensor of Example 2 shows clear spectral characteristics around about 700 nm, a boundary between a visible region and a near infra-red region, but the sensor of Comparative Example 2 shows low wavelength selectivity around about 700 nm.

YSNR10 and a color differences are described in Table 2.

TABLE 2

|  | YSNR10 | $\Delta E^*_{ab}$ |
|---|---|---|
| Example 2 | 141 | 5.7 |
| Example 3 | 135 | 5.9 |
| Example 4 | 136 | 6.0 |
| Comparative Example 2 | 156 | 6.0 |

Referring to Table 2, the sensors of Examples 2 to 4 show low YSNR10 and an equivalent or lower color difference than that of the sensor of Comparative Example 2, and accordingly, color image characteristics of the sensor is expected to be improved.

While this disclosure has been described in connection with what is presently considered to be some practical example embodiments, it is to be understood that the inventive concepts are not limited to the disclosed example embodiments. On the contrary, it is intended to cover various modifications and equivalent arrangements included within the spirit and scope of the appended claims.

What is claimed is:

1. A sensor, comprising:
a visible light sensor configured to sense light in a visible wavelength spectrum;
a near infra-red light sensor configured to sense light in a near infra-red wavelength spectrum; and
an optical filter on the near infra-red light sensor, the optical filter configured to selectively transmit the light in the visible wavelength spectrum and the light in the near infra-red wavelength spectrum,
wherein the near infra-red light sensor is stacked on the visible light sensor such that the near infra-red light sensor is between the visible light sensor and the optical filter,
wherein the optical filter is configured to
selectively transmit light in a first wavelength spectrum associated with the visible wavelength spectrum and light in a second wavelength spectrum associated with the near infra-red wavelength spectrum, and
selectively block light in a third wavelength spectrum between the first wavelength spectrum and the second wavelength spectrum,
wherein the first wavelength spectrum is within about 400 nm to about 700 nm, and the second wavelength spectrum is within about 750 nm to about 1000 nm,
wherein a transmission spectrum of the optical filter has a near infra-red transmission peak in the second wavelength spectrum, and a wavelength range of the near infra-red transmission peak at a 50% transmittance of the transmission spectrum of the optical filter is less than or equal to about 120 nm, and
wherein the near infra-red transmission peak satisfies Relationship Equations 1 and 2:

$\lambda_2 - \lambda_1 \le 50$ nm  [Relationship Equation 1]

$\lambda_4 - \lambda_3 \le 50$ nm  [Relationship Equation 2]

wherein, in Relationship Equations 1 and 2,
$\lambda_1$ is a starting point wavelength in the near infra-red transmission peak,
$\lambda_2$ is a starting point wavelength at which transmittance of the optical filter is greater than or equal to about 50% in the near infra-red transmission peak,
$\lambda_3$ is an end-point wavelength at which the transmittance of the optical filter is greater than or equal to about 50% in the near infra-red transmission peak, and $\lambda_4$ is an end-point wavelength of the near infra-red transmission peak.

2. A sensor, comprising:
a visible light sensor configured to sense light in a visible wavelength spectrum;
a near infra-red light sensor configured to sense light in a near infra-red wavelength spectrum; and
an optical filter on the near infra-red light sensor, the optical filter configured to selectively transmit the light in the visible wavelength spectrum and the light in the near infra-red wavelength spectrum,
wherein the near infra-red light sensor is stacked on the visible light sensor such that the near infra-red light sensor is between the visible light sensor and the optical filter,
wherein the optical filter is configured to
selectively transmit light in a first wavelength spectrum associated with the visible wavelength spectrum and light in a second wavelength spectrum associated with the near infra-red wavelength spectrum, and
selectively book light in a third wavelength spectrum between the first wavelength spectrum and the second wavelength spectrum,
wherein the near infra-red light sensor is on the visible light sensor, and the near infra-red light sensor includes
a pair of electrodes facing each other, and
a near infra-red absorption layer between the pair of electrodes, the near infra-red absorption layer configured to absorb the light in the near infra-red wavelength spectrum,
wherein the near infra-red absorption layer includes an organic light-absorbing material configured to absorb the light in the near infra-red wavelength spectrum, and the second wavelength spectrum is narrower than a light absorption spectrum of the organic light-absorbing material,
wherein a full width at half maximum (FWHM) of a light-absorption spectrum of the organic light-absorbing material is greater than about 120 nm.

3. A sensor, comprising
a visible light sensor configured to sense light in a first wavelength spectrum, the first wavelength spectrum within a visible wavelength spectrum;
a near infra-red light sensor configured to sense light in a second wavelength spectrum, the second wavelength spectrum within a near infra-red wavelength spectrum; and
an optical filter configured to selectively transmit the light in the first wavelength spectrum and the second wavelength spectrum,
wherein the near infra-red light sensor includes
a pair of electrodes facing each other, and
a near infra-red absorption layer between the pair of electrodes, the near infra-red absorption layer including an organic light-absorbing material configured to absorb light in the near infra-red wavelength spectrum,
wherein the second wavelength spectrum is narrower than an absorption wavelength spectrum of the organic light-absorbing material,
wherein a full width at half maximum (FWHM) of a light-absorption spectrum of the organic light-absorbing material is greater than about 120 nm.

4. The sensor of claim 3, wherein
a transmission spectrum of the optical filter has a visible-light transmission peak in the first wavelength spectrum and a near infra-red transmission peak in the second wavelength spectrum,
each wavelength range of the near infra-red transmission peak at 30%, 50%, and 70% transmittances of the transmission spectrum of the optical filter is less than or equal to about 120 nm, and
a wavelength range of a light-absorption peak at 50% absorbance of the light-absorption spectrum of the organic light-absorbing material is greater than about 120 nm.

5. The sensor of claim 3, wherein
the visible light sensor includes a blue sensor configured to sense light in a blue wavelength region, a green sensor configured to sense light in a green wavelength region, and a red sensor configured to sense light in a red wavelength region, and
the near infra-red light sensor is on the blue sensor, the green sensor, and the red sensor.

6. An electronic device comprising the sensor of claim 3.

7. A sensor, comprising:
a visible light sensor configured to sense light in a first wavelength spectrum, the first wavelength spectrum within a visible wavelength spectrum;
a near infra-red light sensor on the visible light sensor, the near infra-red light sensor configured to sense light in a second wavelength spectrum, the second wavelength spectrum within a near infra-red wavelength spectrum; and
an optical filter configured to selectively transmit the light in the first wavelength spectrum and the second wavelength spectrum,
wherein a transmission spectrum of the optical filter has a near infra-red transmission peak in the second wavelength spectrum,
wherein the near infra-red transmission peak satisfies Relationship Equations 1 and 2:

$$\lambda_2 - \lambda_1 \leq 50 \text{ nm} \quad \text{[Relationship Equation 1]}$$

$$\lambda_4 - \lambda_3 \leq 50 \text{ nm} \quad \text{[Relationship Equation 2]}$$

wherein, in Relationship Equations 1 and 2,
$\lambda_1$ is a starting point wavelength in the near infra-red transmission peak,
$\lambda_2$ is a starting point wavelength at which transmittance of the optical filter is greater than or equal to about 50% in the near infra-red transmission peak,
$\lambda_3$ is an end-point wavelength at which the transmittance of the optical filter is greater than or equal to about 50% in the near infra-red transmission peak, and
$\lambda_4$ is an end-point wavelength of the near infra-red transmission peak.

8. The sensor of claim 7, further comprising:
a plurality of photoelectric diodes on a semiconductor substrate, each photoelectric diode of the plurality of photoelectric diodes configured to absorb and convert a different wavelength spectrum into electric signals, the plurality of photoelectric diodes including the visible light sensor and the near infra-red light sensor.

9. The sensor of claim 8, wherein the plurality of photoelectric diodes are stacked vertically on the semiconductor substrate, such that the plurality of photoelectric diodes overlap each other in a direction extending perpendicular to a top surface of the semiconductor substrate.

10. The sensor of claim 7, further comprising:
a photodiode integrated in a semiconductor substrate, the photodiode configured to convert a separate wavelength spectrum into electric signals.
11. The sensor of claim 10, further comprising:
a color filter configured to selectively transmit another wavelength spectrum of incident light to the photodiode, the another wavelength spectrum of the incident light including at least the separate wavelength spectrum, such that the photodiode is configured to absorb the separate wavelength spectrum.
12. An electronic device comprising the sensor of claim 7.

* * * * *